US011615299B2

(12) United States Patent
Mochida et al.

(10) Patent No.: US 11,615,299 B2
(45) Date of Patent: Mar. 28, 2023

(54) NEURAL NETWORK COMPUTATION CIRCUIT INCLUDING NON-VOLATILE SEMICONDUCTOR MEMORY ELEMENT

(71) Applicant: PANASONIC CORPORATION, Osaka (JP)

(72) Inventors: Reiji Mochida, Osaka (JP); Kazuyuki Kouno, Osaka (JP); Yuriko Hayata, Osaka (JP); Takashi Ono, Osaka (JP); Masayoshi Nakayama, Kyoto (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 446 days.

(21) Appl. No.: 16/809,359

(22) Filed: Mar. 4, 2020

(65) Prior Publication Data

US 2020/0202207 A1      Jun. 25, 2020

Related U.S. Application Data

(63) Continuation of application No. PCT/JP2018/032676, filed on Sep. 3, 2018.

(30) Foreign Application Priority Data

Sep. 7, 2017   (JP) .............................. JP2017-171952

(51) Int. Cl.
*G06N 3/06* (2006.01)
*G06N 3/065* (2023.01)
(Continued)

(52) U.S. Cl.
CPC ........... *G06N 3/065* (2023.01); *G06F 7/5443* (2013.01); *G11C 7/1006* (2013.01); *G11C 11/40* (2013.01); *G11C 11/54* (2013.01)

(58) Field of Classification Search
CPC ....... G11C 7/1006; G11C 11/40; G11C 11/54; G06N 3/0635; G06F 7/5443
See application file for complete search history.

(56) References Cited

U.S. PATENT DOCUMENTS

| 5,155,802 A | 10/1992 | Mueller et al. |
| 5,256,911 A | 10/1993 | Holler et al. |
| (Continued) | | |

FOREIGN PATENT DOCUMENTS

| JP | H02-161556 A | 6/1990 |
| JP | H05-264645 A | 10/1993 |
| | (Continued) | |

OTHER PUBLICATIONS

International Search Report and Written Opinion dated Nov. 27, 2018 in International Application No. PCT/JP2018/032676; with partial English translation.

(Continued)

*Primary Examiner* — Vanthu T Nguyen
(74) *Attorney, Agent, or Firm* — McDermott Will & Emery LLP

(57) ABSTRACT

A neural network computation circuit that outputs output data according to a result of a multiply-accumulate operation between input data and connection weight coefficients, the neural network computation circuit includes computation units in each of which a memory element and a transistor are connected in series between data lines, a memory element and a transistor are connected in series between data lines, and gates of the transistors are connected to word lines. The connection weight coefficients are stored into the memory elements. A word line selection circuit places the word lines in a selection state or a non-selection state according to the input data. A determination circuit determines current values flowing in data lines to output output data. A current application circuit has a function of adjusting current values (Continued)

flowing in data lines, and adjusts connection weight coefficients without rewriting the memory elements.

22 Claims, 22 Drawing Sheets

(51) Int. Cl.
*G06F 7/544* (2006.01)
*G11C 11/40* (2006.01)
*G11C 11/54* (2006.01)
*G11C 7/10* (2006.01)

(56) References Cited

U.S. PATENT DOCUMENTS

| | | | | |
|---|---|---|---|---|
| 6,501,256 | B1 * | 12/2002 | Jaussi | G05F 3/30 |
| | | | | 323/315 |
| 6,654,730 | B1 | 11/2003 | Kato et al. | |
| 6,686,788 | B2 * | 2/2004 | Kim | H03K 5/133 |
| | | | | 327/280 |
| 8,018,758 | B2 * | 9/2011 | Yang | G11C 13/0004 |
| | | | | 365/158 |
| 8,817,515 | B2 * | 8/2014 | Kouno | G11C 5/08 |
| | | | | 365/158 |
| 8,837,201 | B2 * | 9/2014 | Bedeschi | G11C 13/0004 |
| | | | | 365/189.11 |
| 9,087,302 | B2 * | 7/2015 | Sim | G06N 3/049 |
| 10,474,948 | B2 * | 11/2019 | Yakopcic | G06N 3/0635 |
| 2008/0172385 | A1 | 7/2008 | Mouttet | |

FOREIGN PATENT DOCUMENTS

| | | |
|---|---|---|
| JP | H06-259585 A | 9/1994 |
| JP | 2001-188767 A | 7/2001 |
| JP | 2009-282782 A | 12/2009 |

OTHER PUBLICATIONS

M. Prezioso, et al., "Training and operation of an integrated neuromorphic network based on metal-oxide memristors," Nature, May 7, 2015; vol. 521, pp. 61-64.

* cited by examiner

FIG. 7A
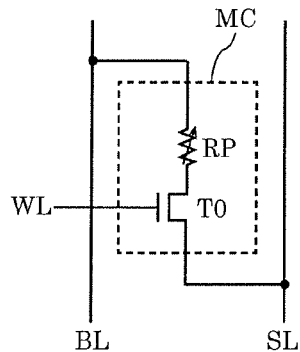
FIG. 7B
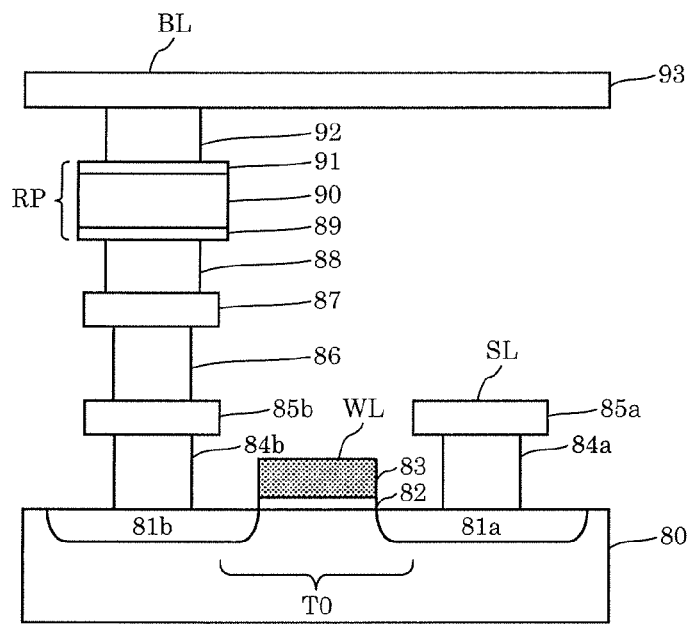
FIG. 7C
| OPERATION | RESET (HIGH RESISTANCE WRITING) | SET (LOW RESISTANCE WRITING) | READOUT |
|---|---|---|---|
| WL | Vg_reset | Vg_set | Vg_read |
| BL | Vreset | VSS | Vread |
| SL | VSS | Vset | VSS |

FIG. 8A

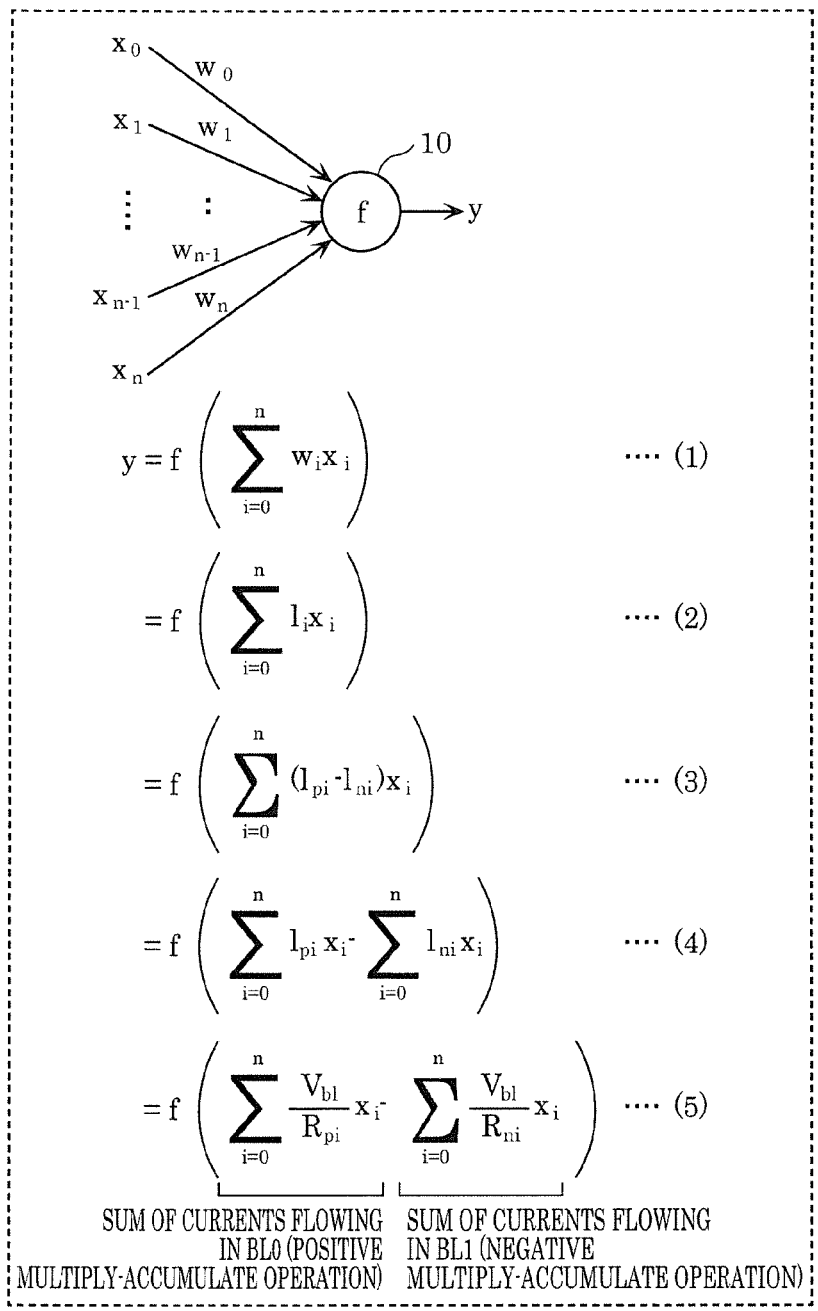

$$y = f\left(\sum_{i=0}^{n} w_i x_i\right) \quad \cdots (1)$$

$$= f\left(\sum_{i=0}^{n} l_i x_i\right) \quad \cdots (2)$$

$$= f\left(\sum_{i=0}^{n} (l_{pi} - l_{ni}) x_i\right) \quad \cdots (3)$$

$$= f\left(\sum_{i=0}^{n} l_{pi} x_i - \sum_{i=0}^{n} l_{ni} x_i\right) \quad \cdots (4)$$

$$= f\left(\underbrace{\sum_{i=0}^{n} \frac{V_{bl}}{R_{pi}} x_i}_{\text{SUM OF CURRENTS FLOWING IN BL0 (POSITIVE MULTIPLY-ACCUMULATE OPERATION)}} - \underbrace{\sum_{i=0}^{n} \frac{V_{bl}}{R_{ni}} x_i}_{\text{SUM OF CURRENTS FLOWING IN BL1 (NEGATIVE MULTIPLY-ACCUMULATE OPERATION)}}\right) \quad \cdots (5)$$

FIG. 8B

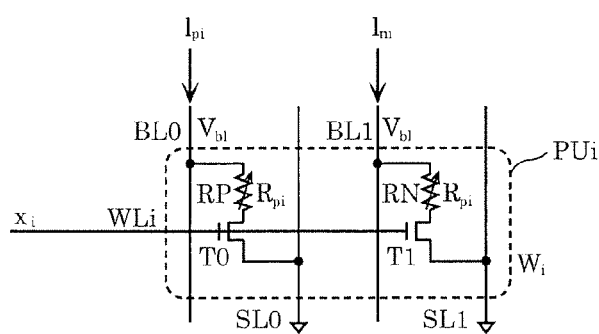

FIG. 9A
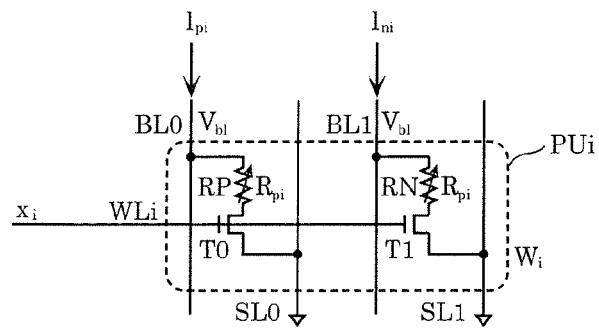
FIG. 9B
| INPUT (xi) | WORD LINE (WLi) |
|---|---|
| 0 | NOT SELECTED |
| 1 | SELECTED |
FIG. 9C
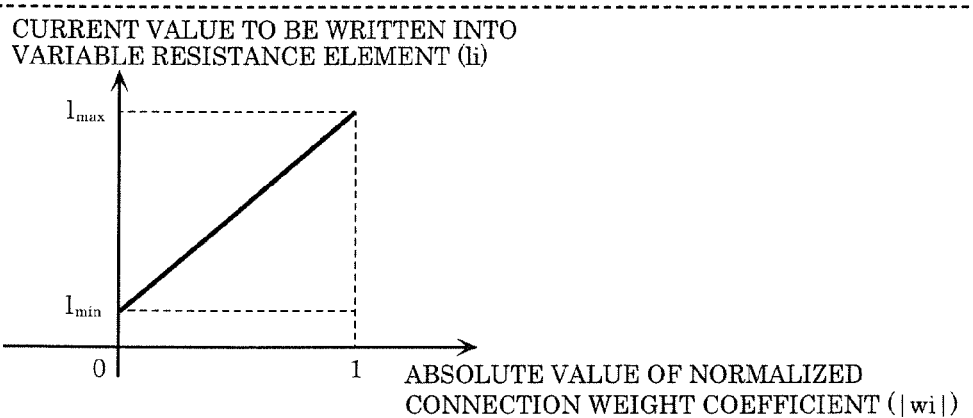

FIG. 9D

| INPUT ($xi$) | CONNECTION WEIGHT COEFFICIENT ($wi$) | MULTIPLY-ACCUMULATE OPERATION ($xi \times wi$) | WORD LINE (WLi) | CURRENT VALUE FLOWING IN BIT LINE BL0/BL1 | |
|---|---|---|---|---|---|
| | | | | BL0 ($lpi$) | BL1 ($lni$) |
| 0 | $wi \geq 0$ | 0 | NOT SELECTED | 0 | 0 |
| 0 | $wi < 0$ | 0 | NOT SELECTED | 0 | 0 |
| 1 | $wi \geq 0$ | $xi \times wi \geq 0$ | SELECTED | $l_{min} + (l_{max} - l_{min}) \times |w_i|$ | $l_{min}$ |
| 1 | $wi < 0$ | $xi \times wi < 0$ | SELECTED | $l_{min}$ | $l_{min} + (l_{max} - l_{min}) \times |w_i|$ |

| CONNECTION WEIGHT COEFFICIENT | VALUE |
|---|---|
| $W_0$ | +0.6 |
| $W_1$ | −0.9 |
| $W_2$ | −1.2 |
| $W_3$ | +1.5 |
| α | +0.3 |

| CONNECTION WEIGHT COEFFICIENT ($w_i$) | | | CURRENT VALUE TO BE WRITTEN INTO VARIABLE RESISTANCE ELEMENT RP/RN | |
|---|---|---|---|---|
| SYMBOL | VALUE | NORMALIZED VALUE | VARIABLE RESISTANCE ELEMENT RP | VARIABLE RESISTANCE ELEMENT RN |
| $W_0$ | +0.6 | +0.4 | 20 µA | 0 µA |
| $W_1$ | −0.9 | −0.6 | 0 µA | 30 µA |
| $W_2$ | −1.2 | −0.8 | 0 µA | 40 µA |
| $W_3$ | +1.5 | +1.0 | 50 µA | 0 µA |
| α | +0.3 | +0.2 | 10 µA (CURRENT APPLIED) | 0 µA |

| INPUT | | OUTPUT | |
|---|---|---|---|
| x1 | x2 | z1 | z2 |
| 0 | 0 | 0 | 1 |
| 0 | 1 | 0 | 1 |
| 1 | 0 | 0 | 1 |
| 1 | 1 | 1 | 0 |

FIG. 13C

| CONNECTION WEIGHT COEFFICIENT | | | VALUE |
|---|---|---|---|
| HIDDEN LAYER | $y_1$ | $w_{10\_y}$ | +0.8 |
| | | $w_{11\_y}$ | −0.6 |
| | | $w_{12\_y}$ | −0.4 |
| | $y_2$ | $w_{20\_y}$ | −0.2 |
| | | $w_{21\_y}$ | −0.8 |
| | | $w_{22\_y}$ | +0.6 |
| | $y_3$ | $w_{30\_y}$ | +0.3 |
| | | $w_{31\_y}$ | +0.6 |
| | | $w_{32\_y}$ | −1.5 |
| OUTPUT LAYER | $z_1$ | $w_{10\_z}$ | +0.9 |
| | | $w_{11\_z}$ | −0.9 |
| | | $w_{12\_z}$ | −1.2 |
| | | $w_{13\_z}$ | −1.5 |
| | $z_2$ | $w_{20\_z}$ | −0.4 |
| | | $w_{21\_z}$ | +1.1 |
| | | $w_{22\_z}$ | −0.3 |
| | | $w_{23\_z}$ | +1.4 |

FIG. 13D

| INPUT LAYER | | | HIDDEN LAYER | | | | | | | | OUTPUT LAYER | | | |
|---|---|---|---|---|---|---|---|---|---|---|---|---|---|---|
| INPUT | | | MULTIPLY-ACCUMULATE OPERATION Σwx | | | | OUTPUT f(Σwx) | | | | MULTIPLY-ACCUMULATE OPERATION Σwy | | OUTPUT f(Σwy) | |
| x0 (bias) | x1 | x2 | y1 | y2 | y3 | y0 (bias) | y1 | y2 | y3 | z1 | z2 | z1 | z2 |
| 1 | 0 | 0 | +0.8 | −0.2 | +0.3 | 1 | 1 | 0 | 1 | −1.5 | +2.1 | 0 | 1 |
| 1 | 0 | 1 | +0.4 | +0.4 | −1.2 | 1 | 1 | 1 | 0 | −1.2 | +0.4 | 0 | 1 |
| 1 | 1 | 0 | +0.2 | −1.0 | +0.9 | 1 | 1 | 0 | 1 | −1.5 | +2.1 | 0 | 1 |
| 1 | 1 | 1 | −0.2 | −0.4 | −0.6 | 1 | 0 | 0 | 0 | +0.9 | −0.4 | 1 | 0 |

FIG. 14A

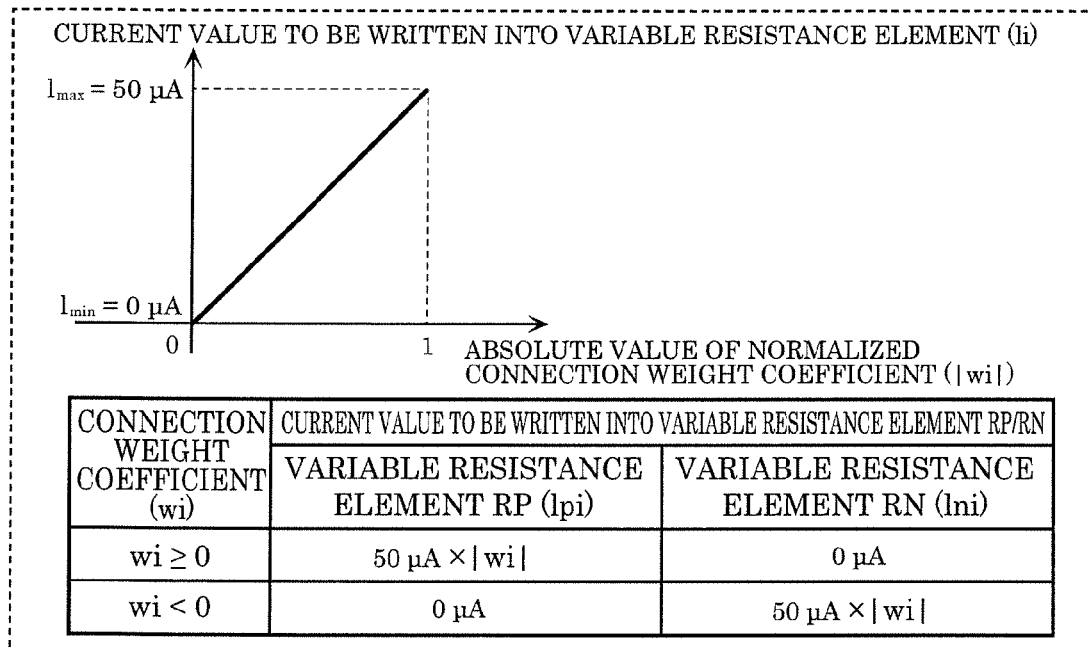

| CONNECTION WEIGHT COEFFICIENT ($w_i$) | CURRENT VALUE TO BE WRITTEN INTO VARIABLE RESISTANCE ELEMENT RP/RN | |
|---|---|---|
| | VARIABLE RESISTANCE ELEMENT RP ($I_{pi}$) | VARIABLE RESISTANCE ELEMENT RN ($I_{ni}$) |
| $w_i \geq 0$ | 50 μA × \|$w_i$\| | 0 μA |
| $w_i < 0$ | 0 μA | 50 μA × \|$w_i$\| |

FIG. 14B

| CONNECTION WEIGHT COEFFICIENT | | | | CURRENT VALUE TO BE WRITTEN INTO VARIABLE RESISTANCE ELEMENT RP/RN | |
|---|---|---|---|---|---|
| | SYMBOL | VALUE | NORMALIZED VALUE | VARIABLE RESISTANCE ELEMENT RP | VARIABLE RESISTANCE ELEMENT RN |
| HIDDEN LAYER | $y_1$ | $w_{10\_y}$ | +0.8 | +0.1 | 50 μA | 0 μA |
| | | $w_{11\_y}$ | −0.6 | −0.75 | 0 μA | 37.5 μA |
| | | $w_{12\_y}$ | −0.4 | −0.5 | 0 μA | 25 μA |
| | $y_2$ | $w_{20\_y}$ | −0.2 | −0.25 | 0 μA | 12.5 μA |
| | | $w_{21\_y}$ | −0.8 | −1.0 | 0 μA | 50 μA |
| | | $w_{22\_y}$ | +0.6 | +0.75 | 37.5 μA | 0 μA |
| | $y_3$ | $w_{30\_y}$ | +0.3 | +0.2 | 10 μA | 0 μA |
| | | $w_{31\_y}$ | +0.6 | +0.4 | 20 μA | 0 μA |
| | | $w_{32\_y}$ | −1.5 | −1.0 | 0 μA | 50 μA |
| OUTPUT LAYER | $z_1$ | $w_{10\_z}$ | +0.9 | +0.6 | 30 μA | 0 μA |
| | | $w_{11\_z}$ | −0.9 | −0.6 | 0 μA | 30 μA |
| | | $w_{12\_z}$ | −1.2 | −0.8 | 0 μA | 40 μA |
| | | $w_{13\_z}$ | −1.5 | −1.0 | 0 μA | 50 μA |
| | $z_2$ | $w_{20\_z}$ | −0.3 | −0.2 | 0 μA | 10 μA |
| | | $w_{21\_z}$ | +1.2 | +0.8 | 40 μA | 0 μA |
| | | $w_{22\_z}$ | −0.3 | −0.2 | 0 μA | 10 μA |
| | | $w_{23\_z}$ | +1.5 | +1.0 | 50 μA | 0 μA |

FIG. 15A

| CONNECTION WEIGHT COEFFICIENT | | | IDEAL VALUE | RESULT OF WRITING |
|---|---|---|---|---|
| OUTPUT LAYER | $z_1$ | $w_{10\_z}$ | +0.9 | ← |
| | | $w_{11\_z}$ | −0.9 | ← |
| | | $w_{12\_z}$ | −1.2 | ← |
| | | $w_{13\_z}$ | −1.5 | ← |
| | $z_2$ | $w_{20\_z}$ | −0.2 | +0.1 |
| | | $w_{21\_z}$ | +1.1 | ← |
| | | $w_{22\_z}$ | −0.3 | −0.8 |
| | | $w_{23\_z}$ | +1.4 | ← |

FIG. 15B

| HIDDEN LAYER | | | | OUTPUT LAYER (IDEAL) | | | | OUTPUT LAYER (RESULT OF WRITING) | | | | OUTPUT LAYER (CURRENT APPLIED) | | | |
|---|---|---|---|---|---|---|---|---|---|---|---|---|---|---|---|
| | OUTPUT $f(\Sigma wx)$ | | | MULTIPLY-ACCUMULATE OPERATION $\Sigma wy$ | | OUTPUT $f(\Sigma wy)$ | | MULTIPLY-ACCUMULATE OPERATION $\Sigma wy$ | | OUTPUT $f(\Sigma wy)$ | | MULTIPLY-ACCUMULATE OPERATION $\Sigma wy$ | | OUTPUT $f(\Sigma wy)$ | |
| y0 | y1 | y2 | y3 | z1 | z2 | z1 | z2 | z1 | z2 | z1 | z2 | z1 | z2 | z1 | z2 |
| 1 | 1 | 0 | 1 | −1.5 | +1.9 | 0 | 1 | −1.5 | +2.2 | 0 | 1 | −1.5 | +2.2 | 0 | 1 |
| 1 | 1 | 1 | 0 | −1.2 | +0.2 | 0 | 1 | −1.2 | −0.3 | 0 | 0 | −0.7 | +0.2 | 0 | 1 |
| 1 | 1 | 0 | 1 | −1.5 | +1.9 | 0 | 1 | −1.5 | +2.2 | 0 | 1 | −1.5 | +2.2 | 0 | 1 |
| 1 | 0 | 0 | 0 | +0.9 | −0.2 | 1 | 0 | +0.9 | +0.1 | 1 | 1 | +0.4 | −0.4 | 1 | 0 |

NEURAL NETWORK COMPUTATION CIRCUIT INCLUDING NON-VOLATILE SEMICONDUCTOR MEMORY ELEMENT

CROSS REFERENCE TO RELATED APPLICATIONS

This application is a U.S. continuation application of PCT International Patent Application Number PCT/JP2018/032676 filed on Sep. 3, 2018, claiming the benefit of priority of Japanese Patent Application Number 2017-171952 filed on Sep. 7, 2017, the entire contents of which are hereby incorporated by reference.

BACKGROUND

1. Technical Field

The present disclosure relates to a neural network computation circuit including a non-volatile semiconductor memory element, which enables low power consumption and large-scale integration, and to a method of operation for the neural network computation circuit.

2. Description of the Related Art

With the progress of information and communication technology, the advent of Internet of Things (IoT) technology, which enables everything to connect to the Internet, has been attracting attention. Although, in the IoT technology, connecting various electronic devices to the Internet is expected to improve the device performance, artificial intelligence (AI) technology in which electronic devices perform self-learning and self-determination has been actively researched and developed as technology for further improving the device performance in recent years.

In the AI technology, a neural network technique is used that imitates human brain information processing in an engineering manner, and semiconductor integrated circuits that perform a neural network computation at high speed and with low power consumption have been actively researched and developed.

Patent Literature (PTL) 1 (Japanese Unexamined Patent Application Publication No. 2001-188767), PTL 2 (Japanese Unexamined Patent Application Publication No. 6-259585), and PTL 3 (Japanese Unexamined Patent Application Publication No. 2-161556) each disclose a conventional neural network computation circuit. A neural network includes basic elements referred to as neurons (sometimes referred to as perceptrons) connected by junctions referred to as synapses with inputs each of which has a different connection weight coefficient. By the neurons being connected to each other, the neural network executes advanced computation processing, such as image recognition and voice recognition. A neuron performs a multiply-accumulate operation that computes the product of each input and each connection weight coefficient and adds all the products. A multiply-accumulate circuit includes: a memory circuit and a register circuit that store inputs and connection weight coefficients; a multiplication circuit that multiplies an input and a connection weight coefficient; an accumulator circuit that cumulatively adds multiplication results; and a control circuit that controls operations performed by these circuit blocks. All the circuit blocks are implemented by digital circuits.

Non-Patent Literature (NPL) 1 (M. Prezioso, et al., "Training and operation of an integrated neuromorphic network based on metal-oxide memristors," Nature, no. 521, pp. 61-64, 2015) discloses another conventional neural network computation circuit. The neural network computation circuit includes variable resistance non-volatile memories capable of setting analog resistance values (conductances). The neural network computation circuit stores analog resistance values (conductances) equivalent to connection weight coefficients in non-volatile memory elements. The neural network computation circuit applies analog voltage values equivalent to inputs to the non-volatile memory elements, and at the same time uses analog current values flowing in the non-volatile memory elements. In a multiply-accumulate operation performed by a neuron, connection weight coefficients are stored as analog resistance values (conductances) in non-volatile memory elements, analog voltage values equivalent to inputs are applied to the non-volatile memory elements, and an analog current value that is the sum of current values flowing in the non-volatile memory elements is obtained as a result of the multiply-accumulate operation. The neural network computation circuit including the non-volatile memory elements enables low power consumption, compared to a neural network computation circuit including the above-described digital circuits. Recent years have seen active process development, device development, and circuit development for a variable resistance non-volatile memory capable of setting an analog resistance value (conductance).

SUMMARY

Unfortunately, the above-described conventional neural network computation circuits have the following problems.

First, the neural network computation circuit including the digital circuits needs to include: a large-capacity memory circuit and a large-capacity register circuit that store a large amount of input data and a lot of connection weight coefficients; a large-scale multiplication circuit and a large-scale cumulative adder circuit (accumulator circuit) that calculate the sum of products between the large amount of input data represented by floating points and the connection weight coefficients; and a large-scale control circuit that controls operations performed by these circuit blocks. Consequently, the chip area of the semiconductor integrated circuit increases.

Next, since it is necessary to cause large-scale digital circuits to operate at high speed in order to perform a high-speed neural network computation, currently commercially available semiconductor chips that execute neural network computation processing consume a significant amount of power ranging from several tens of watts to several hundreds of watts. As a result, the semiconductor integrated circuit requires more power.

In the mean time, in order to reduce the power consumption of the neural network computation circuit including the digital circuits, recently a neural network computation circuit has been proposed that includes variable resistance non-volatile memories capable of setting analog resistance values (conductances). Such a neural network computation circuit performs a multiply-accumulate operation by storing connection weight coefficients as analog resistance values (conductances) in non-volatile memory elements, applying analog voltage values equivalent to inputs to the non-volatile memory elements, and obtaining, as a result of the multiply-accumulate operation, an analog current value that is the sum of current values flowing in the non-volatile memory elements. However, since the inputs and outputs of neurons are processed using analog voltage values or analog current values, it is necessary to transmit information between the neurons using analog values. Accordingly, it is difficult to mount large-scale neural network circuits on a semiconductor integrated circuit, that is, to achieve large-scale semiconductor integration. In order to facilitate information transmission between neurons, there is a method of converting an analog value into a digital value using an analog-digital conversion circuit (AD converter circuit), transmitting information, and converting a digital value into an analog value using a digital-analog conversion circuit (DA converter circuit). Unfortunately, mounting the large-scale neural network circuits requires mounting a lot of analog-digital conversion circuits (AD converter circuits) and digital-analog conversion circuits (DA converter circuits), which is unfavorable from the viewpoint of semiconductor integration.

Moreover, as disclosed in PTL 4 (Japanese Unexamined Patent Application Publication No. 2009-282782), a circuit has been proposed that stores connection weight coefficients as analog resistance values in non-volatile memory elements, and causes, when performing a multiply-accumulate operation, a comparator to compare a charge amount, which reflects analog resistance values accumulated in a capacitor, and a reference voltage. When, for example, a neural network is caused to learn, it is necessary to restore connection weight coefficients to original connection weight coefficients by increasing or decreasing the connection weight coefficients. In this case, however, since the non-volatile memory elements need rewriting, it is difficult to completely restore the analog resistance values to original analog resistance values. Further, the neural network needs a method referred to as softmax that determines the greatest result of a multiply-accumulate operation from among results of multiply-accumulate operations in the final stage. However, since the comparator outputs binary values, it is difficult to determine the greatest result of the multiply-accumulate operation based on the outputs of the comparator.

The present disclosure has been conceived in view of the above problems, and is intended to provide a neural network computation circuit including a non-volatile semiconductor memory element, which enables low power consumption and large-scale integration.

A neural network computation circuit including a non-volatile semiconductor memory element of the present disclosure is a neural network computation circuit that outputs output data of a first logical value or a second logical value, based on a result of a multiply-accumulate operation between input data of the first logical value or the second logical value and connection weight coefficients respectively corresponding to the input data. The neural network computation circuit includes: a plurality of word lines; a first data line; a second data line; a third data line; a fourth data line; a plurality of computation units each of which includes a series connection of a first non-volatile semiconductor memory element and a first cell transistor, and a series connection of a second non-volatile semiconductor memory element and a second cell transistor, the first non-volatile semiconductor memory element having one end connected to the first data line, the first cell transistor having one end connected to the second data line and a gate connected to one of the plurality of word lines, the second non-volatile semiconductor memory element having one end connected to the third data line, the second cell transistor having one end connected to the fourth data line and a gate connected to one of the plurality of word lines; a word line selection circuit that places the plurality of word lines in a selection state or a non-selection state; a determination circuit that determines a magnitude relationship between voltage values or current values applied to the first data line and the third data line or the second data line and the fourth data line, to output the first logical value or the second logical value; and a current application circuit that is connected to at least one of the first data line, the second data line, the third data line, or the fourth data line. The neural network computation circuit stores the connection weight coefficients in the first non-volatile semiconductor memory element and the second non-volatile semiconductor memory element of each of the plurality of computation units. The neural network computation circuit has a function of adjusting any of the connection weight coefficients by the current application circuit applying a current to one of the first data line, the second data line, the third data line, and the fourth data line. The word line selection circuit places the plurality of word lines in the selection state or the non-selection state according to the input data. The determination circuit outputs output data.

Moreover, in the neural network computation circuit of the present disclosure, in the current application circuit, an input of a first current source may be connected to a fifth data line, and the fifth data line may be connected to at least one of the first data line and the second data line via a first switch transistor or the third data line and the fourth data line via a second switch transistor.

Moreover, in the neural network computation circuit of the present disclosure, in the current application circuit, an input of a first current source may be connected to a fifth data line, and an input of a second current source is connected to a sixth data line, the fifth data line may be connected to the first data line or the second data line via a first switch transistor, and the sixth data line may be connected to the third data line or the fourth data line via a second switch transistor.

Moreover, in the neural network computation circuit of the present disclosure, in the current application circuit, one end of a first current generation circuit may be connected to a seventh data line, and another end of the first current generation circuit may be connected to an eighth data line, and the seventh data line or the eighth data line may be connected to at least one of the first data line and the second data line via a first switch transistor or the third data line and the fourth data line via a second switch transistor.

Moreover, in the neural network computation circuit of the present disclosure, in the current application circuit: one end of a first current generation circuit may be connected to a seventh data line, and another end of the first current generation circuit may be connected to an eighth data line; and one end of a second current generation circuit may be connected to a ninth data line, and another end of the second current generation circuit may be connected to a tenth data line, the seventh data line or the eighth data line may be connected to the first data line or the second data line via a first switch transistor, and the ninth data line or the tenth data line may be connected to the third data line or the fourth data line via a second switch transistor.

Moreover, in the neural network computation circuit of the present disclosure, in each of the first current generation circuit and the second current generation circuit, at least one parallel connection of series connection each of which is a series connection of a fixed resistance element, a non-volatile memory element, an element such as a load transistor, or a resistance element and a selection transistor, or a series connection of a load transistor and a selection transistor may be provided.

Moreover, in the neural network computation circuit of the present disclosure, the current application circuit may include at least one current application unit including a series connection of a second resistance element and a third cell transistor, and a series connection of a third resistance element and a fourth cell transistor, the second resistance element having one end connected to the first data line, the third cell transistor having one end connected to the second data line and a gate connected to one of the plurality of word lines, the third resistance element having one end connected to the third data line, the fourth cell transistor having one end connected to the fourth data line and a gate connected to one of the plurality of word lines.

The first resistance element may be configured as a fixed resistance element or a third non-volatile semiconductor memory element.

Moreover, in the neural network computation circuit of the present disclosure, in storing the connection weight coefficients in the first non-volatile semiconductor memory element and the second non-volatile semiconductor memory element of each of the plurality of computation units: when a connection weight coefficient is a positive value, the connection weight coefficient may be written into the first non-volatile semiconductor memory element so that a current value flowing in the first non-volatile semiconductor memory element is in proportion to a value of the connection weight coefficient; and when a connection weight coefficient is a negative value, the connection weight coefficient may be written into the second non-volatile semiconductor memory element so that a current value flowing in the second non-volatile semiconductor memory element is in proportion to a value of the connection weight coefficient.

Moreover, in the neural network computation circuit of the present disclosure, in storing the connection weight coefficients in the first non-volatile semiconductor memory element and the second non-volatile semiconductor memory element of each of the plurality of computation units: when a connection weight coefficient is a positive value, the connection weight coefficient may be written into the first non-volatile semiconductor memory element and the second non-volatile semiconductor memory element so that a current value flowing in the first non-volatile semiconductor memory element is higher than a current value flowing in the second non-volatile semiconductor memory element, and a current difference between the current values is in proportion to a value of the connection weight coefficient; and when a connection weight coefficient is a negative value, the connection weight coefficient may be written into the first non-volatile semiconductor memory element and the second non-volatile semiconductor memory element so that a current value flowing in the second non-volatile semiconductor memory element is higher than a current value flowing in the first non-volatile semiconductor memory element, and a current difference between the current values is in proportion to a value of the connection weight coefficient.

Moreover, in the neural network computation circuit of the present disclosure, the word line selection circuit: may place a corresponding word line in the non-selection state when the input data indicate the first logical value; and may place a corresponding world line in the selection state when the input data indicate the second logical value.

Moreover, in the neural network computation circuit of the present disclosure, a current value may flow in the first data line or the second data line, the current value corresponding to a result of a multiply-accumulate operation between input data having connection weight coefficients that are positive values and corresponding connection weight coefficients having positive values, and a current value may flow in the third data line or the fourth data line, the current value corresponding to a result of a multiply-accumulate operation between input data having connection weight coefficients that are negative values and corresponding connection weight coefficients having negative values.

Moreover, in the neural network computation circuit of the present disclosure, the determination circuit: may output the first logical value when a current value flowing in the first data line or the second data line is lower than a current value flowing in the third data line or the fourth data line; and may output the second logical value when a current value flowing in the first data line or the second data line is higher than a current value flowing in the third data line or the fourth data line.

Moreover, in the neural network computation circuit of the present disclosure, each of the first non-volatile semiconductor memory element and the second non-volatile semiconductor memory element may be one of a variable resistance memory element configured as a variable resistance element, a magnetoresistive memory element configured as a magnetoresistive element, a phase-change memory element configured as a phase-change element, and a ferroelectric memory element configured as a ferroelectric element.

Moreover, in the neural network computation circuit of the present disclosure, when a neural network computation is performed when any connection weight coefficient is changed, the neural network computation may be performed by causing the current application circuit to apply: a current to the first data line or the second data line to increase a connection weight coefficient having a positive value; a current to the third data line or the fourth data line to decrease the connection weight coefficient having the positive value; a current to the third data line or the fourth data line to increase a connection weight coefficient having a negative value; a current to the first data line or the second data line to decrease the connection weight coefficient having the negative value.

Moreover, in the neural network computation circuit of the present disclosure, when determination circuits output second logical values, the current application circuit may apply a current to the third data line or the fourth data line, and, among the determination circuits that output the second logical values, a determination circuit that outputs a largest second logical value may determine a result of a multiply-accumulate operation.

Moreover, in the neural network computation circuit of the present disclosure, when all determination circuits used for a computation output first logical values, the current application circuit may apply a current to the first data line or the second data line, and, among the determination circuits that output the first logical values, a determination circuit that outputs a largest first logical value may determine a result of a multiply-accumulate operation.

The neural network computation circuit including the non-volatile semiconductor memory element of the present disclosure is a neural network circuit in which input data and output data of a neuron each take a binary digital value of 0 or 1. The neural network circuit includes a computing unit including: a series connection of a first non-volatile semiconductor memory element and a first cell transistor between a first data line and a second data line; and a series connection of a second non-volatile semiconductor memory element and a second cell transistor between a third data line and a fourth data line. The neural network circuit stores connection weight coefficients as, for example, resistance values (conductances) in the first non-volatile semiconductor memory element and the second non-volatile semiconductor memory element.

When a connection weight coefficient is a positive value, the connection weight coefficient is written into the first non-volatile semiconductor memory element so that a current value flowing in the first non-volatile semiconductor memory element is in proportion to a value of the connection weight coefficient (a current value flowing in the second non-volatile semiconductor memory element is 0). When a connection weight coefficient is a negative value, the connection weight coefficient is written into the second non-volatile semiconductor memory element so that a current value flowing in the second non-volatile semiconductor memory element is in proportion to a value of the connection weight coefficient (a current value flowing in the first non-volatile semiconductor memory element is 0).

Alternatively, when a connection weight coefficient is a positive value, the connection weight coefficient is written into the first non-volatile semiconductor memory element and the second non-volatile semiconductor memory element so that a current value flowing in the first non-volatile semiconductor memory element is higher than a current value flowing in the second non-volatile semiconductor memory element, and a current difference between the current values is in proportion to the connection weight coefficient. When a connection weight coefficient is a negative value, the connection weight coefficient is written into the first non-volatile semiconductor memory element and the second non-volatile semiconductor memory element so that a current value flowing in the second non-volatile semiconductor memory element is higher than a current value flowing in the first non-volatile semiconductor memory element, and a current difference between the current values is in proportion to the connection weight coefficient. This writing method is effective when a current value flowing in a non-volatile semiconductor memory element cannot be set to 0 or when a current value proportional to a connection weight coefficient cannot be set using only one non-volatile semiconductor memory element.

The word line selection circuit places a word line connected to the gates of the first cell transistor and the second cell transistor into a non-selection state (in case of 0) or a selection state (in case of 1) according to input data (0 or 1), to place the computing unit into an inactive state or an active state.

A current value corresponding to a result of a multiply-accumulate operation between input data having connection weight coefficients that are positive values and the corresponding connection weight coefficients of the positive values flows in the first data line to which the first non-volatile semiconductor memory element is connected. A current value corresponding to a result of a multiply-accumulate operation between input data having connection weight coefficients that are negative values and the corresponding connection weight coefficients of the negative values flows in the third data line to which the second non-volatile semiconductor memory element is connected.

The determination circuit determines a magnitude relationship between the current value flowing in the first data line and the current value flowing in the third data line, to output output data (0 or 1). In other words, the determination circuit outputs 0 when the result of the multiply-accumulate operation between the input data and the connection weight coefficients is a negative value, and outputs 1 when the result of the multiply-accumulate operation between the input data and the connection weight coefficients is a positive value.

Due to the above-described operation, the neural network computation circuit including the non-volatile semiconductor memory element of the present disclosure performs a multiply-accumulate operation of the neural network circuit using current values flowing in the non-volatile semiconductor memory element. With this, the neural network computation circuit can perform a multiply-accumulate operation without including a large-capacity memory circuit, a large-capacity register circuit, a large-scale multiplication circuit, a large-scale cumulative circuit (accumulator circuit), and a complex control circuitry that are configured as conventional digital circuits. Accordingly, it is possible to reduce the power consumption of the neural network computation circuit, and decrease the chip area of a semiconductor integrated circuit. Moreover, since the neural network circuit includes neurons having input data and output data that are digital data of 0 or 1, it is possible to digitally transmit information between neurons, it is easy to mount a large-scale neural network circuit including neurons, and it is possible to integrate large-scale neural network circuits.

In other words, the neural network computation circuit including the non-volatile semiconductor memory element of the present disclosure enables low power consumption and large-scale integration. The details will be disclosed in the following embodiments.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 7A is a circuit diagram of memory cell MC, a non-volatile semiconductor memory element, which is included in the memory cell array illustrated in FIG. 6.

FIG. 7B is a cross-sectional view of memory cell MC.

FIG. 7C is a diagram illustrating applied voltages in each operation mode of memory cell MC.

FIG. 8A is a diagram illustrating a calculation indicating the operating principles of the neural network computation circuit according to an embodiment.

FIG. 8B is a diagram illustrating an operation of computation unit PUi according to an embodiment.

FIG. 9A is a diagram illustrating an operation of computation unit PUi.

FIG. 9B is a diagram illustrating a state of word line WLi in relation to input $x_i$ of computation unit PUi according to an embodiment.

FIG. 9C is a diagram illustrating a current range of variable resistance elements RP and RN of computation unit PUi and a calculation of current values to be written into the variable resistance elements according to an embodiment.

FIG. 9D is a diagram illustrating a multiply-accumulate operation between input $x_i$ and connection weight coefficient $w_i$ performed by computation unit PUi according to an embodiment.

FIG. 13C is a diagram illustrating connection weight coefficients of the neural network circuit according to Embodiment 2.

FIG. 13D is a diagram illustrating computational operations performed by an input layer, a hidden layer, and an output layer of the neural network circuit according to Embodiment 2.

FIG. 14A is a diagram illustrating a current range of variable resistance elements of a computation unit, and current values to be written into the variable resistance elements, according to Embodiment 2.

FIG. 14B is a diagram illustrating a current range of variable resistance elements of a computation unit of a neural network computation circuit according to Embodiment 2, and current values to be written into the variable resistance elements.

FIG. 15A is a diagram illustrating connection weight coefficients of the output layer.

FIG. 15B is a diagram illustrating results of neural network computations performed by the output layer according to Embodiment 2.

DETAILED DESCRIPTION OF THE EMBODIMENTS

Hereinafter, embodiments of the present disclosure will be described with reference to the drawings.

Figure 1A:
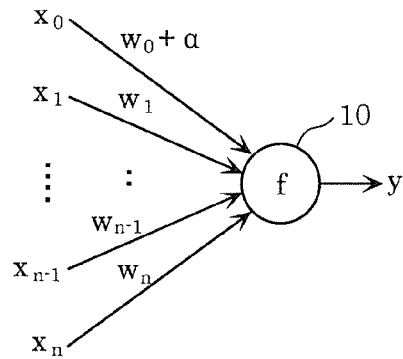
FIG. 1A is a diagram illustrating a neuron used in a neural network computation.
Figure 1B:
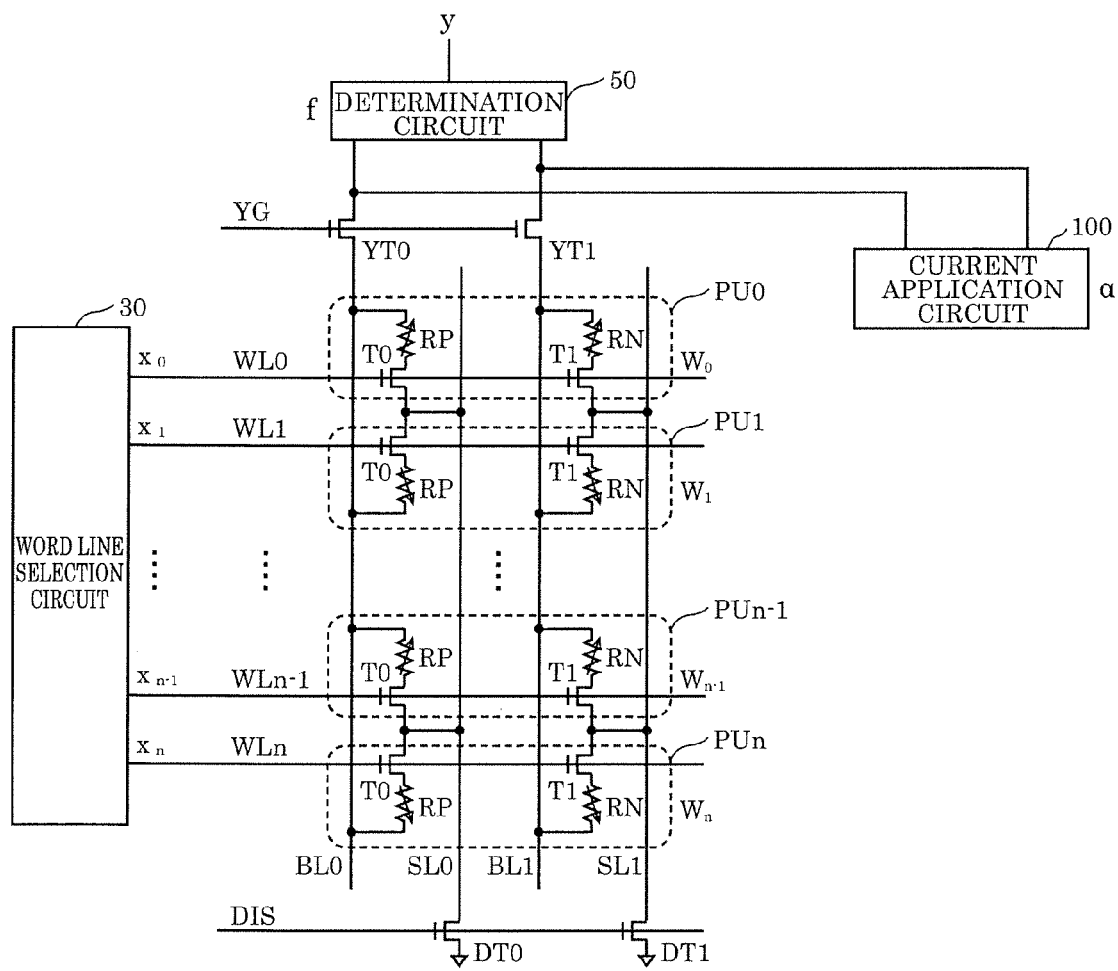
FIG. 1B is a diagram illustrating a detailed configuration of a circuit that performs a computation of the neuron illustrated in FIG. 1A.

FIG. 1A and FIG. 1B each are a diagram illustrating a detailed configuration of a neural network computation circuit including a non-volatile semiconductor memory element according to an embodiment. FIG. 1A is a diagram illustrating a neuron used in a neural network computation. FIG. 1B is a diagram illustrating a detailed configuration of a circuit that performs a computation of the neuron illustrated in FIG. 1A, and is a representative figure illustrating the features of the present disclosure. FIG. 1A and FIG. 1B will be described in detail later.

[Neural Network Computation]

First, the following describes the basic theory of neural network computation.

Figure 2:
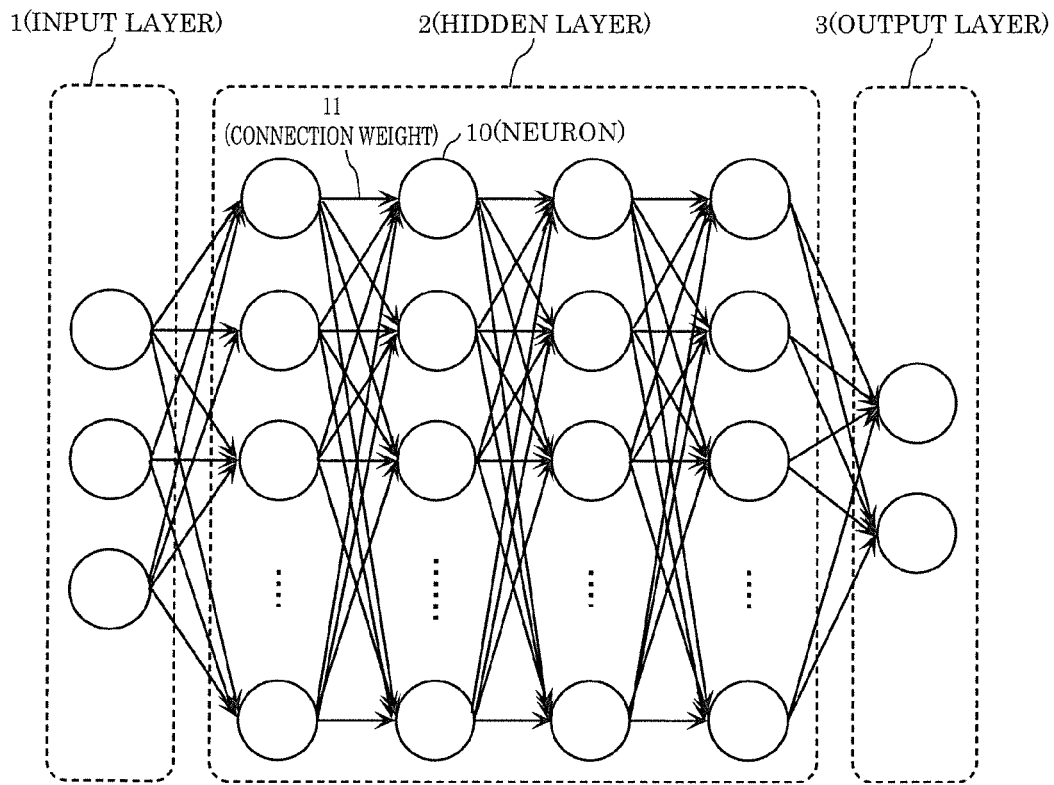
FIG. 2 is a diagram illustrating a configuration of a deep neural network.

FIG. 2 is a diagram illustrating a configuration of a deep neural network. A neural network includes: input layer 1 to which input data are inputted; hidden layer 2 (sometimes referred to as a middle layer) that receives the input data of input layer 1 and performs a computation; and output layer 3 that receives output data of hidden layer 2 and performs a computation. In each of input layer 1, hidden layer 2, and output layer 3, there are many basic elements of the neural network referred to as neurons 10, and each neuron 10 is connected to other neurons 10 via connection weights 11. Connection weights 11, each of which has a different connection weight coefficient, connect the neurons. Neuron 10 receives input data, performs a multiply-accumulate operation between the input data and corresponding connection weight coefficients, and outputs a result of the multiply-accumulate operation as output data. Here, in the sense that hidden layer 2 includes connected columns (four columns in FIG. 2) of neurons, which forms a deep neural network, the neural network illustrated in FIG. 2 is referred to as a deep neural network.

Figure 3:
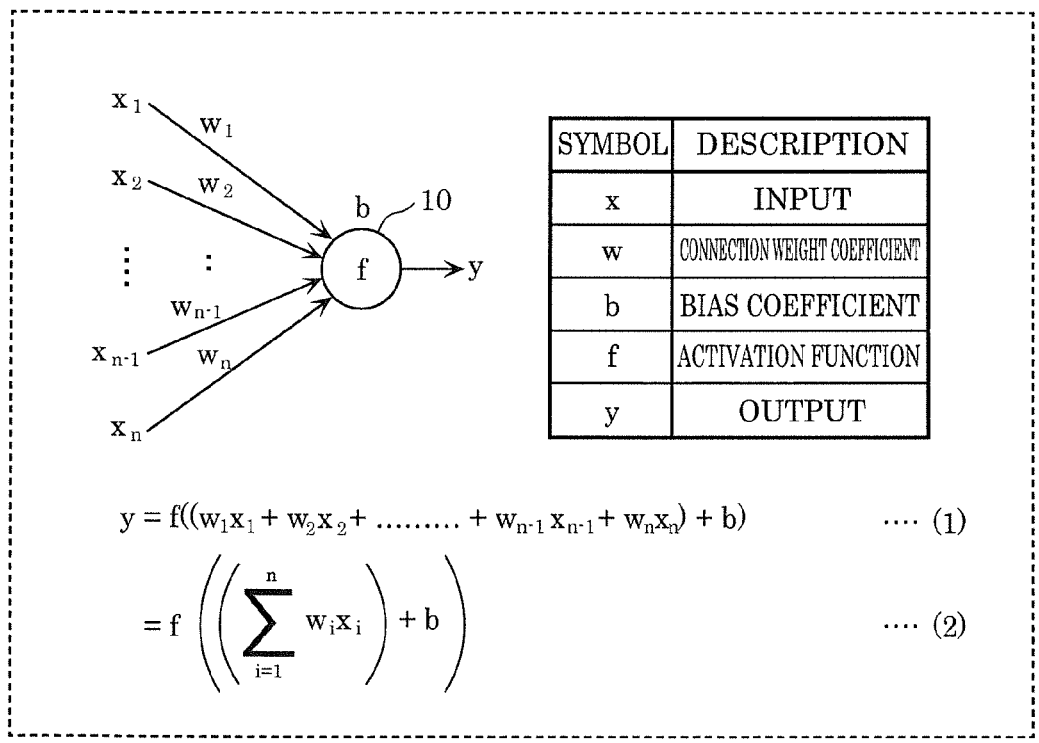
FIG. 3 is a diagram illustrating a calculation performed by a neuron in a neural network computation.

FIG. 3 is a diagram illustrating a calculation performed by a neuron in a neural network computation. The calculation performed by neuron 10 is expressed by equation (1) and equation (2) in FIG. 3. Neuron 10 is connected to n inputs $x_1$ to $x_n$ via connection weights each having a corresponding one of connection weight coefficients $w_1$ to $w_n$, and performs a multiply-accumulate operation between inputs $x_1$ to $x_n$ and connection weight coefficients $w_1$ to $w_n$. Neuron 10 has bias coefficient b and adds bias coefficient b to a result of the multiply-accumulate operation between inputs $x_1$ to $x_n$ and connection weight coefficients $w_1$ to $w_n$. Neuron 10 has activation function f and performs a computation on a result obtained by adding bias coefficient b to the result of the multiply-accumulate operation between inputs $x_1$ to $x_n$ and connection weight coefficients $w_1$ to $w_n$, using activation function f, to output y.

Figure 4:
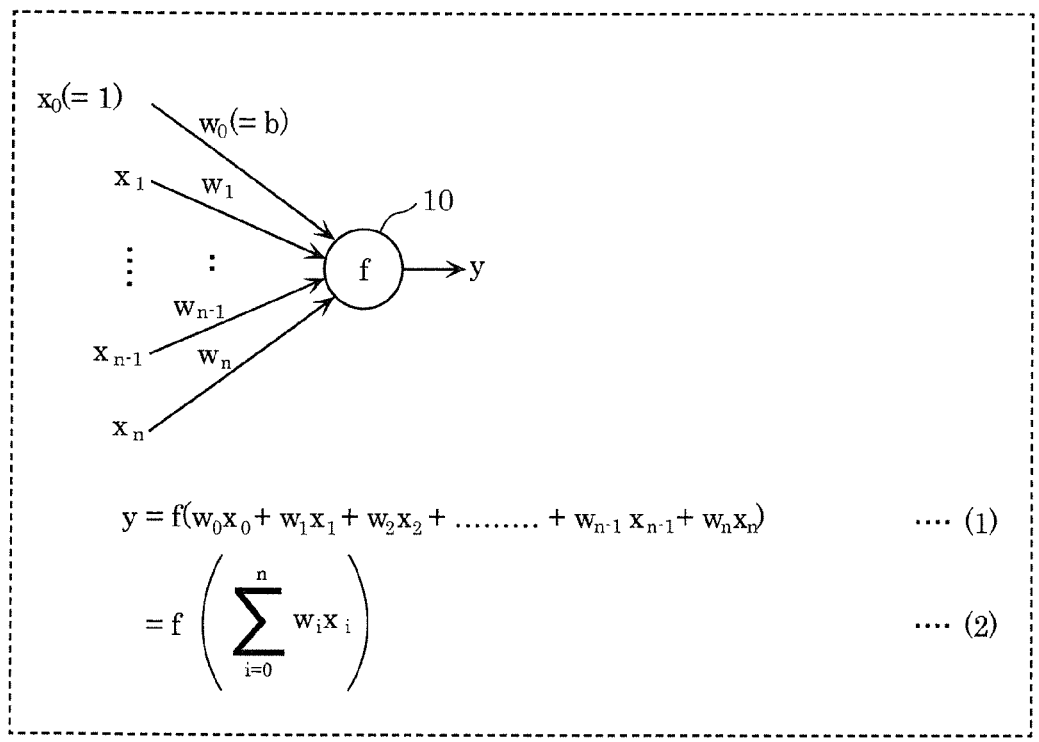
FIG. 4 is a diagram illustrating a case in which a computation of bias coefficient b is assigned to input $x_0$ and connection weight coefficient $w_0$ in a calculation performed by a neuron in a neural network computation.

FIG. 4 is a diagram illustrating a case in which a computation of bias coefficient b is assigned to input $x_0$ and connection weight coefficient $w_0$ in a calculation performed by a neuron in a neural network computation. The calculation performed by neuron 10 is expressed by equation (1) and equation (2) in FIG. 4. Neuron 10 performs the multiply-accumulate operation between inputs $x_1$ to $x_n$ and connection weight coefficients $w_1$ to $w_n$ and adds bias coefficient b in FIG. 3. However, as illustrated in FIG. 4, by assigning the addition of bias coefficient b to input $x_0=1$ and connection weight coefficient $w_0=b$, it is possible to interpret that neuron 10 is connected to n+1 inputs $x_0$ to $x_n$ via connection weights each having a corresponding one of connection weight coefficients $w_0$ to $w_n$. As shown by equation (1) and equation (2) in FIG. 4, the calculation performed by neuron 10 can be concisely expressed by only the sum of products between inputs $x_0$ to $x_n$ and connection weight coefficients $w_0$ to $w_n$. In the present embodiment, as illustrated in FIG. 4, the addition of bias coefficient b is expressed as input $x_0=1$ and connection weight coefficient $w_0=b$.

Figure 5:
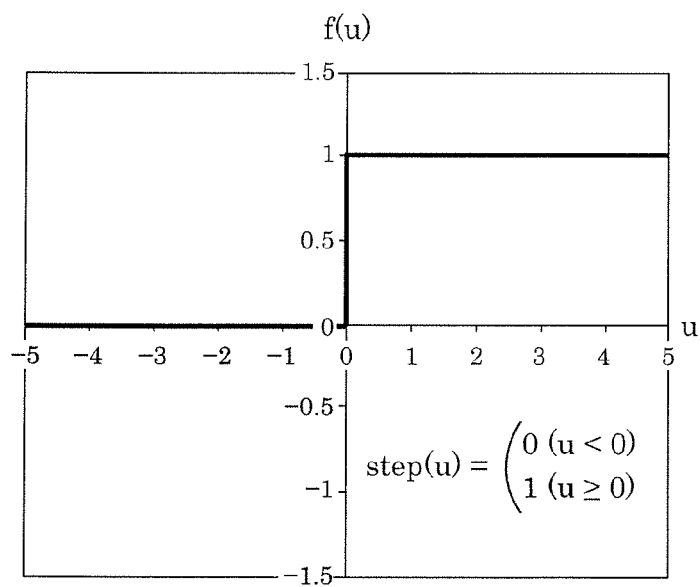
FIG. 5 is a diagram illustrating activation function f for a neuron in neural network computation according to an embodiment.

FIG. 5 is a diagram illustrating activation function f for a neuron in neural network computation according to the embodiment. The x axis indicates input u of activation function f, and the y axis indicates output f(u) of activation function f. In the present embodiment, a step function is used as activation function f. Although the step function is used as the activation function in the present embodiment, examples of other activation functions used in the neural network computation include a sigmoid function. As illustrated in FIG. 5, the step function outputs output f(u)=0 when input u is a negative value (<0), and outputs output f(u)=1 when input u is a positive value (≥0). When neuron 10 illustrated in FIG. 4 uses activation function f of the step function, neuron 10 outputs output y=0 when a result of a multiply-accumulate operation between inputs $x_0$ to $x_n$ and connection weight coefficients $w_0$ to $w_n$ is a negative value, and outputs output y=1 when the result of the multiply-accumulate operation is a positive value.

[Entire Configuration of Neural Network Computation Circuit Including Non-Volatile Semiconductor Memory Element]

Figure 6:
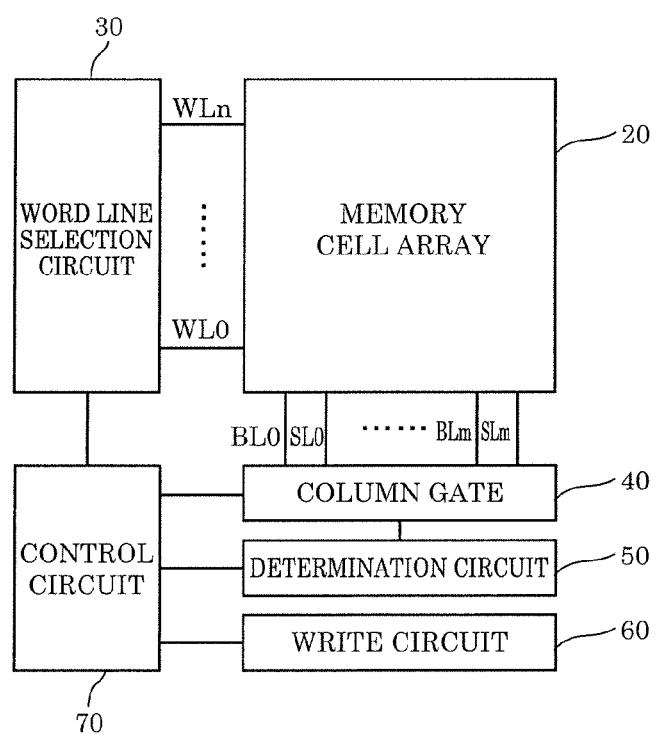
FIG. 6 is a diagram illustrating an entire configuration of a neural network computation circuit including a non-volatile semiconductor memory element according to an embodiment.

FIG. 6 is a diagram illustrating an entire configuration of a neural network computation circuit including a non-volatile semiconductor memory element according to the embodiment. The neural network computation circuit of the present disclosure includes memory cell array 20, word line selection circuit 30, column gate 40, determination circuit 50, write circuit 60, and control circuit 70.

Memory cell array 20 includes non-volatile semiconductor memory elements arranged in a matrix, and the non-volatile semiconductor memory elements store connection weight coefficients used in neural network computation.

Memory cell array 20 has word lines WL0 to WLn, bit lines BL0 to BLm, and source lines SL0 to SLm.

Word line selection circuit 30 drives word lines WL0 to WLn of memory cell array 20. Word line selection circuit 30 places a word line into a selection state or a non-selection state according to an input from a neuron in the neural network computation (to be described later).

Column gate 40 is connected to bit lines BL0 to BLm and source lines SL0 to SLm, selects a predetermined bit line and a predetermined source line from among the bit lines and the source lines, and connects the predetermined bit line and the predetermined source line to determination circuit 50 and write circuit 60 described later.

Determination circuit 50 is connected to bit lines BL0 to BLm and source lines SL0 to SLm via column gate 40, and detects current values flowing in the bit lines or the source lines to output output data. Determination circuit 50 reads out data stored in a memory cell of memory cell array 20 to output output data of a neuron in the neural network computation (to be described later).

Write circuit 60 is connected to bit lines BL0 to BLm and source lines SL0 to SLm via column gate 40, and applies a rewrite voltage to a non-volatile semiconductor memory element of memory cell array 20.

Control circuit 70 controls operations of memory cell array 20, word line selection circuit 30, column gate 40, determination circuit 50, and write circuit 60, and controls a readout operation, a write operation, and a neural network computational operation performed on a memory cell of memory cell array 20.

[Configuration of Non-Volatile Semiconductor Memory Element]

FIG. 7A to FIG. 7C are a circuit diagram of a non-volatile semiconductor memory element according to the embodiment, a cross-sectional view of the non-volatile semiconductor memory element, and a diagram illustrating applied voltages in each operation of the non-volatile semiconductor memory element, respectively.

FIG. 7A is a circuit diagram of memory cell MC, a non-volatile semiconductor memory element, which is included in memory cell array 20 illustrated in FIG. 6. Memory cell MC is a 1T1R memory cell that is configured of a series connection of variable resistance element RP and cell transistor T0, and includes one cell transistor T0 and one variable resistance element RP. Variable resistance element RP is a non-volatile semiconductor memory element referred to as a resistive random access memory (ReRAM). Memory cell MC has word line WL connected to the gate terminal of cell transistor T0, bit line BL connected to variable resistance element RP, and source line SL connected to the source terminal of cell transistor T0.

FIG. 7B is a cross-sectional view of memory cell MC. Diffusion regions 81a and 81b are disposed on semiconductor substrate 80. Diffusion region 81a serves as the source terminal of cell transistor T0, and diffusion region 81b serves as the drain terminal of the cell transistor. A space between diffusion regions 81a and 81b serves as a channel region of cell transistor T0. Oxide film 82 and gate electrode 83 including polysilicon are disposed above the channel region. These elements serve as cell transistor T0. Diffusion region 81, the source terminal of cell transistor T0, is connected to source line SL that is first interconnect layer 85a via via 84a. Diffusion region 81b, the drain terminal of cell transistor T0, is connected to first interconnect layer 85b via via 84b. Moreover, first interconnect layer 85b is connected second interconnect layer 87 via via 86, and second interconnect layer 87 is connected to variable resistance element RP via via 88. Variable resistance element RP includes lower electrode 89, variable resistance layer 90, and upper electrode 91. Variable resistance element RP is connected to bit line BL that is third interconnect layer 93 via via 92.

FIG. 7C is a diagram illustrating applied voltages in each operation mode of memory cell MC.

A reset operation (high resistance writing) applies a voltage of Vg_reset (e.g. 2 V) to word line WL to place cell transistor T0 into a non-selection state, applies a voltage of Vreset (e.g. 2.0 V) to bit line BL, and applies ground voltage VSS (0 V) to source line SL. With this, variable resistance element RP changes to a high resistance state by a positive voltage being applied to the upper electrode.

A set operation (low resistance writing) applies a voltage of Vg_set (e.g. 2.0 V) to word line WL to place cell transistor T0 into a selection state, applies ground voltage VSS (0 V) to bit line BL, and applies a voltage of Vset (e.g. 2.0 V) to source line SL. With this, variable resistance element RP changes to a low resistance state by a positive voltage being applied to the lower electrode.

A readout operation applies a voltage of Vg_read (e.g. 1.1 V) to word line WL to place cell transistor T0 into the selection state, applies a voltage of Vread (e.g. 0.4 V) to bit line BL, and applies ground voltage VSS (0 V) to source line SL. With this, when variable resistance element RP is in the high resistance state (reset state), a small memory cell current flows in variable resistance element RP, and when variable resistance element RP is in the low resistance state (set state), a large memory cell current flows in variable resistance element RP. Data stored in the memory cell is read out by the determination circuit determining a difference between the current values.

When memory cell MC is used as a semiconductor memory that stores 0 or 1, a resistance value of variable resistance element RP can be in only two resistance states (digital) of a high resistance state (0) and a low resistance state (1). However, when memory cell MC is used as an element in the neural network computation circuit of the present disclosure, a resistance value of variable resistance element RP is set to be a variable (analog) value, and used.

[Detailed Configuration of Neural Network Computation Circuit Including Non-Volatile Semiconductor Memory Element]

FIG. 1A and FIG. 1B each are a diagram illustrating a detailed configuration of a neural network computation circuit including a non-volatile semiconductor memory element according to the embodiment.

FIG. 1A is a diagram illustrating a neuron used in a neural network computation, and is the same as FIG. 4. Neuron 10 receives n+1 inputs $x_0$ to $x_n$ each having a corresponding one of connection weight coefficients $w_0$ to $w_n$. Inputs $x_0$ to $x_n$ can take a value of 0 or a value of 1, and connection weight coefficients $w_0$ to $w_n$ can take a variable (analog) value. A computation is performed on a result of a multiply-accumulate operation between inputs $x_0$ to $x_n$ and connection weight coefficients $w_0$ to $w_n$ using activation function f, the step function illustrated in FIG. 5, to output output y.

FIG. 1B is a diagram illustrating a detailed configuration of a circuit that performs a computation of neuron 10 illustrated in FIG. 1A. The memory cell array has word lines WL0 to WLn, bit lines BL0 and BL1, and source lines SL0 and SL1.

Word lines WL0 to WLn correspond to inputs $x_0$ to $x_n$ of neuron 10. Specifically, word line WL0 corresponds to input $x_0$, word line WL1 corresponds to input $x_1$, word line WLn-1 corresponds to input $x_{n-1}$, and word line WLn corresponds to input $x_n$. Word line selection circuit 30 places word lines WL0 to WLn into a selection state or a non-selection state according to inputs $x_0$ to $x_n$. Word line selection circuit 30 places a word line into the non-selection state when an input is 0, and places a word line into the selection state when an input is 1. Since each of inputs $x_0$ to $x_n$ can take a value of 0 or a value of 1 in an arbitrary manner in the neural network computation, when two or more inputs among inputs $x_0$ to $x_n$ have the value of 1, word line selection circuit 30 selects two or more word lines simultaneously.

Connection weight coefficients $w_0$ to $w_n$ of neuron 10 correspond to computation units PU0 to PUn including memory cells. Specifically, connection weight coefficient $w_0$ corresponds to computation unit PU0, connection weight coefficient $w_1$ corresponds to computation unit PU1, connection weight coefficient $w_{n-1}$ corresponds to computation unit PUn-1, and connection weight coefficient $w_n$ corresponds to computation unit PUn.

Computation unit PU0 includes a memory cell composed of variable resistance element RP and cell transistor T0, and a memory cell composed of variable resistance element RN and cell transistor T1. In other words, one computation unit includes two memory cells. Computation unit PU0 is connected to word line WL0, bit lines BL0 and BL1, and source lines SL0 and SL1. Word line WL0 is connected to the gate terminals of cell transistors T0 and T1. Bit line BL0 is connected to variable resistance element RP. Source line SL0 is connected to the source terminal of cell transistor T0. Bit line BL1 is connected to variable resistance element RN. Source line SL1 is connected to the source terminal of cell transistor T1. Input $x_0$ is inputted via word line WL0 of computation unit PU0, and connection weight coefficient $w_0$ is stored as a resistance value (conductance) in two variable resistance elements RP and RN of computation unit PU0. Since computation units PU1, PUn-1, and PUn have the same configuration as computation unit PU0, the detailed description thereof will be omitted. Each of inputs $x_0$ to $x_n$ is inputted via a corresponding one of word lines WL0 to WLn connected to computation units PU0 to PUn, and each of connection weight coefficients $w_0$ to $w_n$ is stored as a resistance value (conductance) in variable resistance elements RP and RN of computation units PU0 to PUn.

Bit line BL0 is connected to determination circuit 50 via column gate transistor YT0, and bit line BL1 is connected to determination circuit 50 via column gate transistor YT1. The gate terminals of column gate transistors YT0 and YT1 are connected to column gate control signal YG. Activation of column gate control signal YG connects bit lines BL0 and BL1 to determination circuit 50. Source line SL0 is connected to ground voltage via discharge transistor DT0, and source line SL1 is connected to ground voltage via discharge transistor DT1. The gate terminals of discharge transistors DT0 and DT1 are connected to discharge control signal DIS. Activation of discharge control signal DIS connects source lines SL0 and SL1 to ground voltage. When a neural network computational operation is performed, the activation of column gate control signal YG and discharge control signal DIS connects bit lines BL0 and BL1 to determination circuit 50, and source lines SL0 and SL1 to ground voltage.

Determination circuit 50 detects and compares current values flowing in bit lines BL0 and BL1 connected to determination circuit 50 via column gate transistors YT0 and YT1, to output output y. Output y can take a value of 0 or a value of 1. Determination circuit 50 outputs output y having the value of 0 when the current value flowing in bit line BL0 is smaller than the current value flowing in bit line BL1, and outputs output y having the value of 1 when the current value flowing in bit line BL0 is larger than the current value flowing in bit line BL1. In other words, determination circuit 50 determines a magnitude relationship between the current values flowing in bit lines BL0 and BL1, to output output y.

Current application circuit 100 applies current to at least one of bit line BL0 or bit line BL1.

Figure 16A:
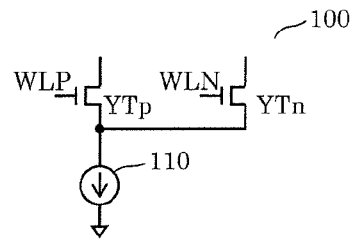
FIG. 16A is a diagram illustrating a configuration example of a current application circuit.

As illustrated in FIG. 16A, current application circuit 100 can apply current from current source 110 to bit line BL0 or bit line BL1 by an input of current source 110 being connected to bit line BL0 via switch transistor YTp and an input of current source 110 being connected to bit line BL1 via switch transistor YTn. In addition, an input of current source 110 may be connected to only one of bit line BL0 via switch transistor YTp and bit line BL1 via switch transistor YTn.

Figure 16B:
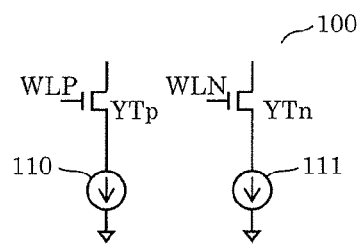
FIG. 16B is a diagram illustrating the second configuration example of the current application circuit.

FIG. 16B is a diagram illustrating the second configuration example of current application circuit 100. Current application circuit 100 can apply current from current source 110 to bit line BL0 by an input of current source 110 being connected to bit line BL0 via switch transistor YTp, and can apply current from current source 111 to bit line BL1 by an input of current source 111 being connected to bit line BL1 via switch transistor YTn.

Figure 16C:
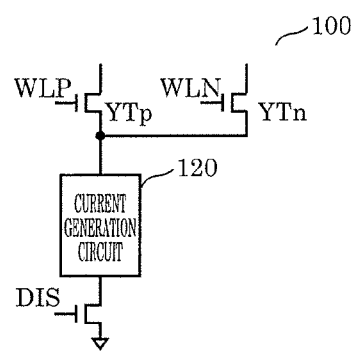
FIG. 16C is a diagram illustrating the third configuration example of the current application circuit.

FIG. 16C is a diagram illustrating the third configuration example of current application circuit 100. Current application circuit 100 can apply current from current generation circuit 120 to bit line BL0 or bit line BL1 by one end of current generation circuit 120 being connected to bit line BL0 via switch transistor YTp and connected to bit line BL1 via switch transistor YTn, and the other end of current generation circuit 120 being connected to ground voltage by activating discharge control signal DIS. In addition, the one end of current generation circuit 120 may be connected to only one of bit line BL0 via switch transistor YTp and bit line BL1 via switch transistor YTn.

Figure 16D:
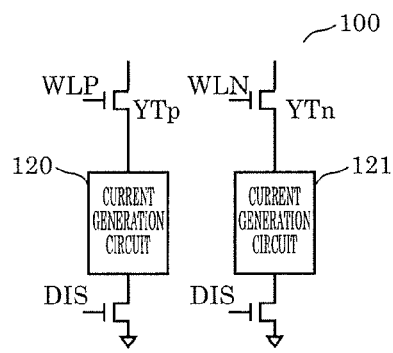
FIG. 16D is a diagram illustrating the fourth configuration example of the current application circuit.

FIG. 16D is a diagram illustrating the fourth configuration example of current application circuit 100. Current application circuit 100 can apply current from current generation circuit 120 to bit line BL0 and current from current generation circuit 121 to bit line BL1 by one end of current generation circuit 120 being connected to bit line BL0 via switch transistor YTp, one end of current generation circuit 121 being connected to bit line BL1 via switch transistor YTn, and the other ends of current generation circuits 120 and 121 being connected to ground voltage by activating discharge control signal DIS.

Figure 16E:
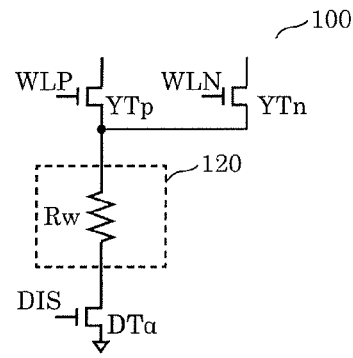
FIG. 16E is a diagram illustrating a specific configuration of a current generation circuit in the current application circuit.
Figure 16F:
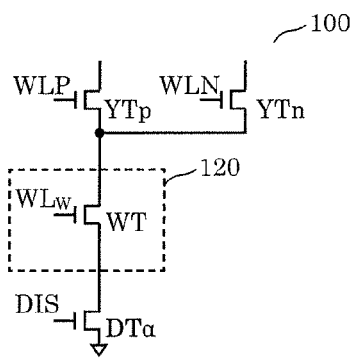
FIG. 16F is a diagram illustrating a specific configuration of a current generation circuit in the current application circuit.
Figure 16G:
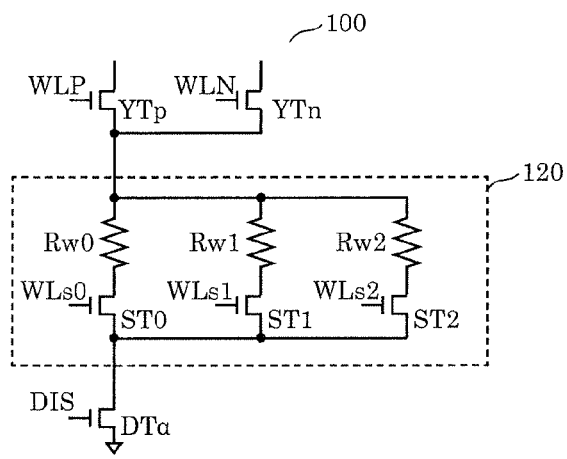
FIG. 16G is a diagram illustrating a specific configuration of a current generation circuit in the current application circuit.
Figure 16H:
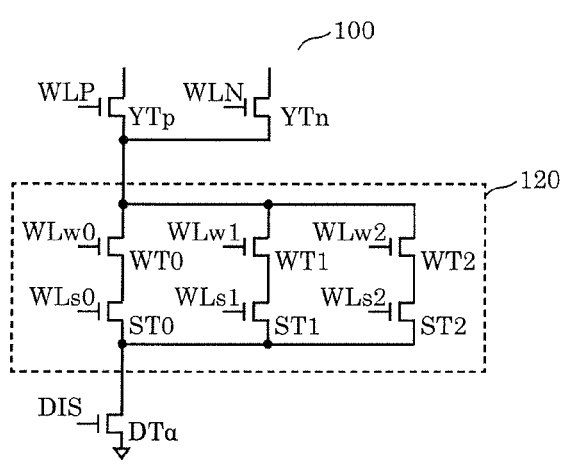
FIG. 16H is a diagram illustrating a specific configuration of a current generation circuit in the current application circuit.

FIG. 16E, FIG. 16F, FIG. 16G, and FIG. 16H each are a diagram illustrating a specific configuration of current generation circuit 120 in current application circuit 100. As illustrated in FIG. 16E, current generation circuit 120 is configured as resistance element Rw. Resistance element Rw may be configured as a fixed resistance element or a nonvolatile memory element. As illustrated in FIG. 16, current generation circuit 120 is configured as load transistor WT. The gate of load transistor WT is controlled using load gate voltage WLw. As illustrated in FIG. 16G, in current generation circuit 120, at least one parallel connection of series connections of resistance elements Rw0 to Rw2 and selection transistors ST0 to ST2 is provided. As illustrated in FIG. 16H, in current generation circuit 120, at least one parallel connection of series connections of load transistors WT0 to WT2 and selection transistors ST0 to ST2 is provided. The gates of load transistors WT0 to WT2 are controlled using load gate voltages WLw0 to WLw2.

Figure 17:
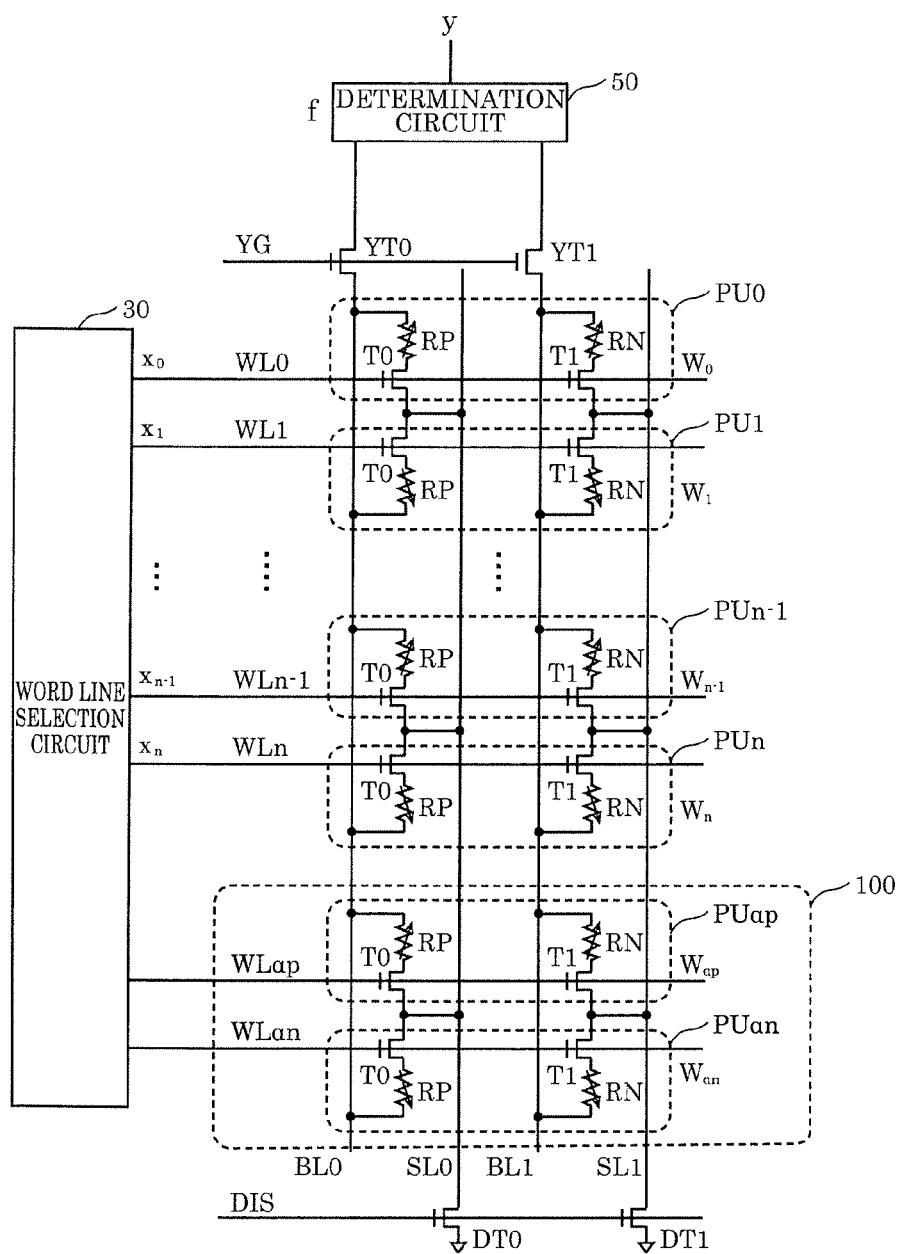
FIG. 17 is a diagram illustrating details when a current application circuit is disposed in a memory cell array.

FIG. 17 is a diagram illustrating the fifth configuration example of current application circuit 100. As illustrated in FIG. 17, current application circuit 100 may be disposed in a memory cell array. Currents to be added correspond to current application units PUαp and PUαn including memory cells. Connection weight coefficient wαp to be added corresponds to current application unit PUαp, and connection weight coefficient wαn to be added corresponds to current application unit PUαn.

Current application units PUαp and PUαn each include a memory cell composed of variable resistance element RP and cell transistor T0, and a memory cell composed of variable resistance element RN and cell transistor T1. In other words, one current application unit includes two memory cells. Current application unit PUαp is connected to word line WLαp, bit lines BL0 and BL1, and source lines SL0 and SL1. Word line WLαp is connected to the gate terminals of cell transistors T0 and T1. Bit line BL0 is connected to variable resistance element RP. Source line SL0 is connected to the source terminal of cell transistor T0. Bit line BL1 is connected to variable resistance element RN. Source line SL1 is connected to the source terminal of cell transistor T1. Since current application unit PUαn has the same configuration as current application unit PUαp, the detailed description thereof will be omitted. In other words, any current value can be applied to bit lines BL0 and BL1 by setting to variable resistance element RP a resistance value equivalent to a current to be applied to BL0, setting to variable resistance element RN a resistance value equivalent to a current to be applied to BL1, and selecting corresponding word lines WLαp and WLαn. Here, each of the variable resistance elements may be configured as a fixed resistance element or a load transistor. In addition, one or more current application units PUαp and PUαn may be provided.

The following describes in detail the operating principles of and the operating method for the neural network computation circuit including the non-volatile semiconductor memory element thus configured, and a method of storing a connection weight coefficient in a variable resistance element.

[Operating Principles of Neural Network Computation Circuit Including Non-Volatile Semiconductor Memory Element]

FIG. 8A and FIG. 8B are a diagram illustrating a calculation indicating the operating principles of the neural network computation circuit according to the embodiment, and a diagram illustrating an operation of a computation unit, respectively.

FIG. 8A is a diagram illustrating a calculation indicating the operating principles of the neural network computation circuit according to the embodiment. As shown by equation (1) in FIG. 8A, neuron 10 performs a computation on a result of a multiply-accumulate operation between input $x_i$ and connection weight coefficient $w_i$, using activation function f that is a step function. As shown by equation (2) in FIG. 8A, the present disclosure is characterized by replacing connection weight coefficient $w_i$ with current value $I_i$ flowing in a variable resistance element (memory cell) and performing a multiply-accumulate operation between input $x_i$ and current value $I_i$ flowing in the variable resistance element (memory cell).

Here, connection weight coefficient $w_i$ takes both a positive value (≥0) and a negative value (<0) in a neural network computation. When a product between input $x_i$ and connection weight coefficient $w_i$ in the multiply-accumulate operation is a positive value, addition is performed. When a product between input $x_i$ and connection weight coefficient $w_i$ in the multiply-accumulate operation is a negative value, subtraction is performed. However, since current value $I_i$ flowing in the variable resistance element (memory cell) can take only a positive value, while addition when a product between input $x_i$ and connection weight coefficient $w_i$ is a positive value can be performed by addition of current value $I_i$, there is a need to figure out how subtraction when a product between input $x_i$ and connection weight coefficient $w_i$ is a negative value is performed using current value $I_i$ that is a positive value.

FIG. 8B is a diagram illustrating an operation of computation unit PUi according to the embodiment. The configuration of computation unit PUi is as illustrated in FIG. 1A and FIG. 1B, and thus the detailed description thereof will be omitted. The present disclosure is characterized by storing connection weight coefficient $w_i$ in two variable resistance elements RP and RN. A resistance value set to variable resistance element RP, a resistance value set to variable resistance element RN, a voltage applied to bit lines BL0 and BL1, and current values flowing in variable resistance elements RP and RN are denoted by Rpi, Rni, Vbl, and Ipi and Ini, respectively. The present disclosure is also characterized by adding a positive result of a multiply-accumulate operation to a current flowing in bit line BL0, and adding a negative result of a multiply-accumulate operation to a current flowing in bit line BL1. Resistance values Rpi and Rni (current values Ipi and Ini) of variable resistance elements RP and RN are set so that the currents flow as described above. Connecting as many computation units PUi as inputs $x_0$ to $x_n$ (connection weight coefficients $w_0$ to $w_n$) to bit lines BL0 and BL1 in parallel as illustrated in FIG. 1B makes it possible to provide a positive result of a multiply-accumulate operation in neuron 10 as a current value flowing in bit line BL0, and a negative result of a multiply-accumulate operation in neuron 10 as a current value flowing in bit line BL1. Calculations for the above-described operation are represented by equation (3), equation (4), and equation (5) in FIG. 8A. In other words, properly writing resistance values Rpi and Rni, equivalent to connection weight coefficient $w_i$, into variable resistance elements RP and RN of computation unit PUi makes it possible to provide the current value of bit line BL0 corresponding to the positive result of the multiply-accumulate operation, and the current value of bit line BL1 corresponding to the negative result of the multiply-accumulate operation.

Current values flowing in bit lines BL0 and BL1 are detected and determined so that since activation function f is a step function (0 is outputted when an input is a negative value (<0), 1 is outputted when an input is a positive value (≥0)) in equation (5) in FIG. 8A, when the current value flowing in bit line BL0, which is a positive result of a multiply-accumulate operation, is smaller than the current value flowing in bit line BL1, which is a negative result of a multiply-accumulate operation, that is, all results of multiply-accumulate operations are negative values, 0 is outputted, and when the current value flowing in bit line BL0, which is a positive result of a multiply-accumulate operation, is larger than the current value flowing in bit line BL1, which is a negative result of a multiply-accumulate operation, that is, all results of multiply-accumulate operations are positive values, 1 is outputted. This enables the neural network computation in neuron 10 using computation unit PUi including variable resistance elements RP and RN.

FIG. 9A to FIG. 9D each are a diagram illustrating a detailed operation of a computation unit according to the embodiment. FIG. 9A is a diagram illustrating an operation of computation unit PUi. Since FIG. 9A is the same as FIG. 8B, the detailed description thereof will be omitted. The following describes a multiply-accumulate operation between input $x_1$ and connection weight coefficient $w_i$ in computation unit PUi.

FIG. 9B is a diagram illustrating a state of word line WLi in response to input $x_i$ of computation unit PUi according to the embodiment. Input $x_i$ takes a value of 0 or a value of 1. When input $x_i$ is 0, word line WLi is placed in a non-selection state. When input $x_i$ is 1, word line WLi is placed in a selection state. Word line WLi is connected to the gate terminals of cell transistors T0 and T1. When word line WLi is in the non-selection state, cell transistors T0 and T1 are in an inactive state (cut-off state), and current does not flow in bit lines BL0 and BL1 regardless of resistance values Rpi and Rni of variable resistance elements RP and RN. In contrast, when word line WLi is in the selection state, cell transistors T0 and T1 are in an activation state (connection state), and current flows in bit lines BL0 and BL1 based on resistance values Rpi and Rni of variable resistance elements RN and RN.

FIG. 9C is a diagram illustrating a current range of variable resistance elements RP and RN of computation unit PUi, and a calculation of current values to be written into the variable resistance elements, according to the embodiment. A possible range of current values flowing in variable resistance elements RP and RN is assumed to be from minimum value $I_{min}$ to maximum value $I_{max}$. Absolute value $|w_i|$ of a connection weight coefficient inputted to a neuron is normalized to be in a range from 0 to 1. A current value to be written into a variable resistance element is determined so that the current value is a current value (analog value) in proportion to connection weight coefficient $|w_i|$ after normalization.

When connection weight coefficient $w_i$ is a positive value (≥0), in order to add a result of a multiply-accumulate operation (≥0) between input $x_i$ (0 or 1) and connection weight coefficient $w_i$ (≥0) as a current value to bit line BL0 in which a current of a positive result of the multiply-accumulate operation flows, resistance value Rpi that causes current value $I_{min}+(I_{max}-I_{min})\times|w_i|$ in proportion to absolute value $|w_i|$ of the connection weight coefficient to flow is written into variable resistance element RP connected to bit line BL0, and resistance value Rni that causes current value $I_{min}$ (equivalent to connection weight coefficient of 0) to flow is written into variable resistance element RN connected to bit line BL1.

In contrast, when connection weight coefficient $w_i$ is a negative value (<0), in order to add a result of a multiply-accumulate operation (<0) between input $x_i$ (0 or 1) and connection weight coefficient $w_i$ (<0) as a current value to bit line BL1 in which a current of a negative result of the multiply-accumulate operation flows, resistance value Rni that causes current value $I_{min}+(I_{max}-I_{min})\times|w_i|$ in proportion to absolute value $|w_i|$ of the connection weight coefficient to flow is written into variable resistance element RN connected to bit line BL1, and resistance value Rpi that causes current value $I_{min}$ (equivalent to a connection weight coefficient of 0) to flow is written into variable resistance element RP connected to bit line BL0.

By setting the resistance values (current values) to be written into variable resistance elements RP and RN as above, differential current $(I_{max}-I_{min})\times|w_i|$ between the current (equivalent to the positive result of the multiply-accumulate operation) flowing in bit line BL0 and the current (equivalent to the negative result of the multiply-accumulate operation) flowing in bit line BL1 is obtained as a current value equivalent to a result of a multiply-accumulate operation between an input and a connection weight coefficient. A method of normalizing absolute value $|w_i|$ of a connection weight coefficient to be in a range from 0 to 1 will be described in detail later.

FIG. 9D is a diagram illustrating a multiply-accumulate operation between input $x_i$ and connection weight coefficient $w_i$ performed by computation unit PUi according to the embodiment.

When input $x_i$ is 0, result of multiply-accumulate operation $x_i \times x_i$ is 0 regardless of a value of connection weight coefficient $w_i$. Since input $x_i$ is 0, word line WLi is placed in the non-selection state, and cell transistors T0 and T1 are placed in the inactive state (cut-off state). As a result, current values Ipi and Ini flowing in bit lines BL0 and BL1 are 0. In other words, since result of multiply-accumulate operation $x_i \times x_i$ is 0, no current flows both in bit line BL0 in which a current equivalent to a positive result of a multiply-accumulate operation flows, and in bit line BL1 in which a current equivalent to a negative result of a multiply-accumulate operation flows.

When input $x_i$ is 1 and connection weight coefficient $w_i$ is a positive value ($\geq 0$), result of multiply-accumulate operation $x_i \times x_i$ is a positive value ($\geq 0$). Since input $x_1$ is 1, word line WLi is placed in the selection state, and cell transistors T0 and T1 are placed in the activation state (connection state). As a result, currents Ipi and Ini illustrated in FIG. 9C flow in bit lines BL0 and BL1 based on resistance values of variable resistance elements RP and RN. Large amount of differential current $(I_{max}-I_{min}) \times |w_i|$ between current Ipi equivalent to the positive result of the multiply-accumulate operation flowing in bit line BL0 and current Ini equivalent to the negative result of the multiply-accumulate operation flowing in bit line BL1 flows as a current equivalent to result of multiply-accumulate operation $x_1 \times x_i$ ($\geq 0$) between input $x_1$ and connection weight coefficient $w_i$, in bit line BL0, compared to bit line BL1.

When input $x_1$ is 1 and connection weight coefficient $w_i$ is a negative value ($<0$), result of multiply-accumulate operation $x_1 \times x_1$ is a negative value ($<0$). Since input $x_1$ is 1, word line WLi is placed in the selection state, and cell transistors T0 and T1 are placed in the activation state (connection state). As a result, currents Ipi and Ini illustrated in FIG. 9C flow in bit lines BL0 and BL1 based on resistance values of variable resistance elements RP and RN. Large amount of differential current $(I_{max}-I_{min}) \times |w_i|$ between current Ipi equivalent to the positive result of the multiply-accumulate operation flowing in bit line BL0 and current Ini equivalent to the negative result of the multiply-accumulate operation flowing in bit line BL1 flows as a current equivalent to result of multiply-accumulate operation $x_i \times x_i$ ($\leq 0$) between input $x_i$ and connection weight coefficient $w_i$, in bit line BL1, compared to bit line BL0.

As above, the current equivalent to the result of the multiply-accumulate operation between input $x_i$ and connection weight coefficient $w_i$ flows in bit lines BL0 and BL1, the large amount of the current flows in bit line BL0 in the case of the positive result of the multiply-accumulate operation, compared to bit line BL1, and the large amount of the current flows in bit line BL1 in the case of the negative result of the multiply-accumulate operation, compared to bit line BL0. Connecting as many computation units PUi as inputs $x_0$ to $x_n$ (connection weight coefficients $w_0$ to $w_n$) to bit lines BL0 and BL1 in parallel makes it possible to provide a result of a multiply-accumulate operation in neuron 10 as a differential current between a current flowing in bit line BL0 and a current flowing in bit line BL1.

Here, a determination circuit connected to bit lines BL0 and BL1 is caused to output output data of 0 when a current value flowing in bit line BL0 is smaller than a current value flowing in bit line BL1, that is, a result of a multiply-accumulate operation is a negative value, and to output output data of 1 when a current value flowing in bit line BL0 is larger than a current value flowing in bit line BL1, that is, when a result of a multiply-accumulate operation is a positive value. This is equivalent to the determination circuit performing a computation using an activation function of a step function, and enables a neural network computation that performs the multiply-accumulate operation and the computation using the activation function.

[Neural Network Computation Circuit Including Non-Volatile Semiconductor Memory Element According to Embodiment 1]

The operating principles of the neural network computation circuit including the non-volatile semiconductor memory element according to the present disclosure have been described above. Hereinafter, specific embodiments will be described.

Figures 10A, 10B:
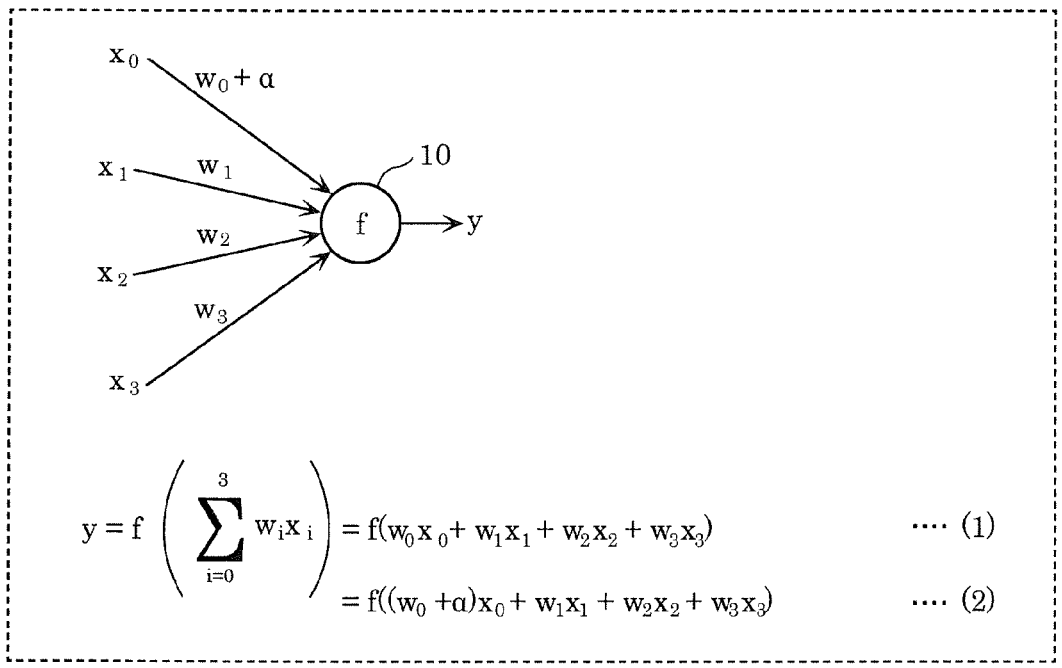
FIG. 10A is a diagram illustrating a configuration of neural network computation according to Embodiment 1.
FIG. 10B is a diagram illustrating values of connection weight coefficients in the neural network computation according to Embodiment 1.

FIG. 10A is a diagram illustrating a configuration of neural network computation according to Embodiment 1. FIG. 10B is a diagram illustrating values of connection weight coefficients in the neural network computation according to Embodiment 1. As illustrated in FIG. 10A, neuron 10 has four inputs $x_0$ to $x_3$ and corresponding connection weight coefficients $w_0$ to $w_3$. A computation performed by neuron 10 is represented by equation (1) in FIG. 10A. Activation function f of neuron 10 is a step function.

As illustrated in FIG. 10B, the connection weight coefficients of neuron 10 are $w_0=+0.6$, $w_1=-0.9$, $w_2=-1.2$, and $w_3=+1.5$. The following describes a neural network computation circuit including a non-volatile semiconductor memory element that performs a computational operation of neuron 10 illustrated in FIG. 10A and FIG. 10B.

Figure 11:
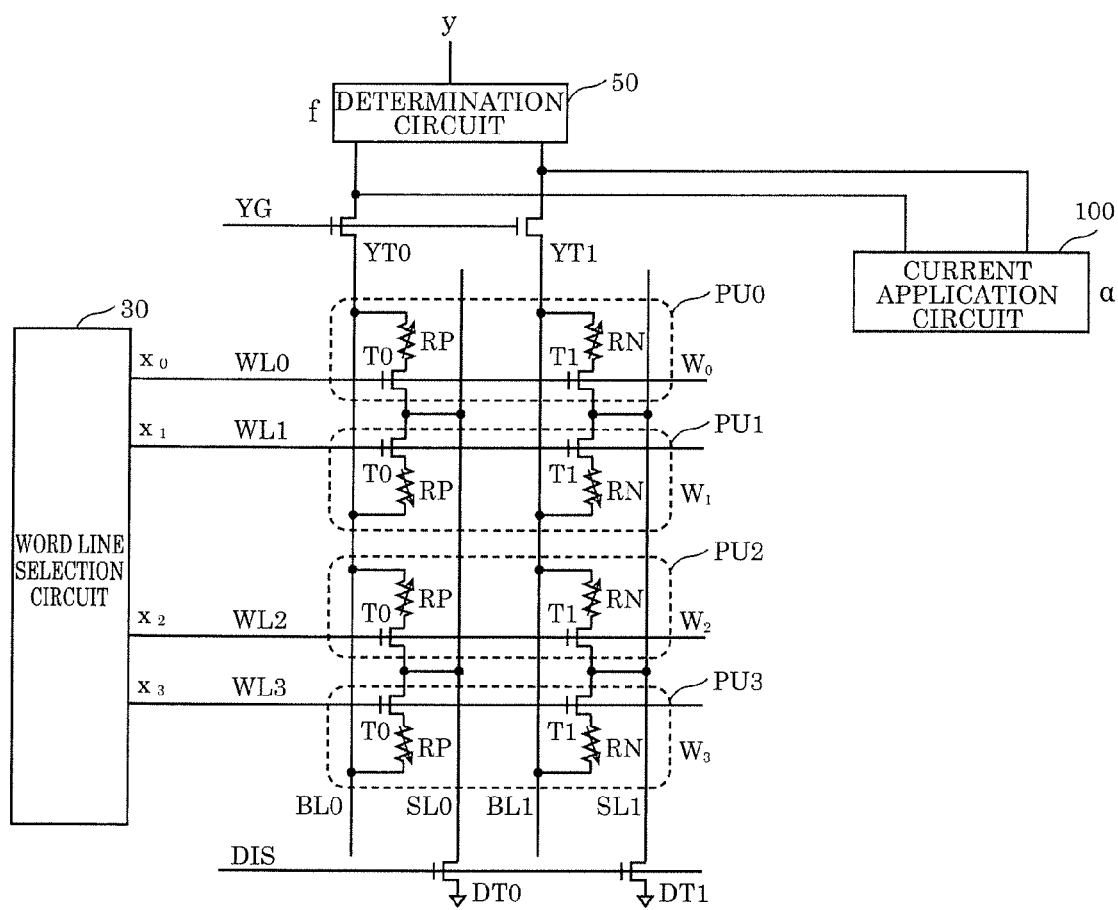
FIG. 11 is a diagram illustrating a detailed configuration of a neural network computation circuit according to Embodiment 1.

FIG. 11 is a diagram illustrating a detailed configuration of a neural network computation circuit according to Embodiment 1. In FIG. 11, the same elements as in FIG. 1B are assigned the same reference numerals and numbers, and the detailed description thereof will be omitted. The neural network computation circuit according to Embodiment 1 is a neuron having four inputs and one output, and includes: four computation units PU0 to PU3 that store connection weight coefficients $w_0$ to $w_3$; four word lines WL0 to WL3 corresponding to inputs $x_0$ to $x_3$; bit line BL0 and source line SL0 to which variable resistance elements RP and cell transistors T0 are connected; and bit line BL1 and source line SL1 to which variable resistance elements RN and cell transistors T1 are connected.

When a neural network computational operation is performed, each of word lines WL0 to WL3 and cell transistors T0 and T1 of computation units PU0 to PU3 are placed in a selection state or a non-selection state according to inputs $x_0$ to $x_3$. Bit lines BL0 and BL1 are supplied with bit line voltage via column gates YT0 and YT1 by determination circuit 50, and source lines SL0 and SL1 are connected to ground voltage via discharge transistors DT0 and DT1. For this reason, a current equivalent to a positive result of a multiply-accumulate operation flows in bit line BL0, and a current equivalent to a negative result of a multiply-accumulate operation flows in bit line BL1. Determination circuit 50 detects and determines a magnitude relationship between the currents flowing in bit lines BL0 and BL1, to output output y. In other words, determination circuit 50 outputs 0 when a result of a multiply-accumulate operation in neuron 10 is a negative value ($<0$), and outputs 1 when a result of a multiply-accumulate operation in neuron 10 is a positive value ($\geq 0$). Determination circuit 50 outputs a result of the computation using activation function f (step function), using the result of the multiply-accumulate operation as an input.

Figures 12A, 12B:
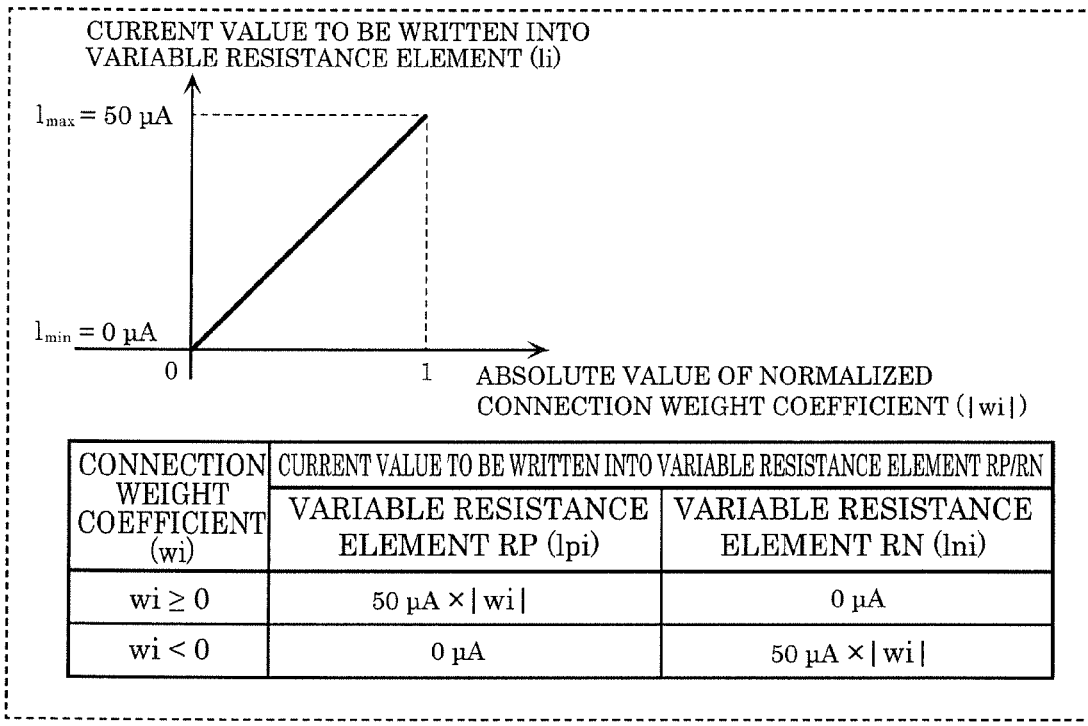
FIG. 12A is a diagram illustrating a current range of variable resistance elements of a computation unit and current values to be written into the variable resistance elements according to Embodiment 1.
FIG. 12B is a diagram illustrating a current range of variable resistance elements RP and RN of computation units PU0 to PU3 and current values (resistance values) to be written into variable resistance elements RP and RN.

FIG. 12A and FIG. 12B each are a diagram illustrating a current range of variable resistance elements RP and RN of computation units PU0 to PU3 and current values (resistance values) to be written into variable resistance elements RP and RN according to Embodiment 1. As illustrated in FIG. 12A, a possible range of current values flowing in variable resistance elements RP and RN is from 0 µA to 50 µA in Embodiment 1. Stated differently, a current value has minimum value $I_{min}$ of 0 µA and maximum value $I_{max}$ of 50 µA, and a 50-µA current range (dynamic range) is used.

As illustrated in FIG. 12B, first, connection weight coefficients $w_0$ to $w_3$ are normalized to be in a range from 0 to 1. In the present embodiment, among connection weight coefficients $w_0$ to $w_3$, $w_3=+1.5$ has the largest absolute value, and the normalized value of this connection weight coefficient is $w_3=+1.0$. The normalized values of the remaining connection weight coefficients are $w_0=+0.4$, $w_1=-0.6$, and $w_2=-0.8$.

Next, as illustrated in FIG. 12A, current values to be written into variable resistance elements RP and RN of computation units PU0 to PU3 are determined using the normalized connection weight coefficients. FIG. 12B shows a result of calculations of the current values to be written into variable resistance elements RP and RN. Since the normalized value of connection weight coefficient $w_0$ is +0.4, a positive value, the current value to be written into variable resistance element RP is 20 μA, and the current value to be written into variable resistance element RN is 0 μA. Since the normalized value of connection weight coefficient $w_1$ is −0.6, a negative value, the current value to be written into variable resistance element RP is 0 μA, and the current value to be written into variable resistance element RN is 30 μA. Since the normalized value of connection weight coefficient $w_2$ is −0.8, a negative value, the current value to be written into variable resistance element RP is 0 μA, and the current value to be written into variable resistance element RN is 40 μA. Since the normalized value of connection weight coefficient $w_3$ is +1.0, a positive value, the current value to be written into variable resistance element RP is 50 μA, and the current value to be written into variable resistance element RN is 0 μA. In this manner, writing the current values (resistance values) into variable resistance elements RP and RN of computation units PU0 to PU3 makes it possible to perform the neural network computation.

In Embodiment 1, the following further describes a method of performing a neural network computation for which a connection weight coefficient is adjusted using a current application circuit without rewriting variable resistance elements RP and RN.

For example, in order to perform a neural network computation when connection weight coefficient $w_0$ is +0.9, connection weight coefficient α is added to connection weight coefficient $w_0$ as illustrated in FIG. 10A. As illustrated in FIG. 10B, connection weight coefficient $w_0$ is +0.6, and connection weight coefficient α is +0.3. The computation performed then by neuron 10 is expressed by equation (2) in FIG. 10A.

Next, as illustrated in FIG. 12A, an applied current value of the current application circuit is determined using a normalized connection weight coefficient in the same manner as variable resistance elements RP and RN. FIG. 12B shows a result of a calculation of the applied current value of the current application circuit. When input $x_0$ is inputted and world line WL0 is in the selection state, the normalized value of connection weight coefficient α is +0.2, a positive value, the current application circuit applies a current value of 10 μA to BL0.

In this manner, it is possible to perform the neural network computation for which the connection weight coefficient is adjusted using the current application circuit without rewriting variable resistance elements RP and RN.

[Neural Network Computation Circuit Including Nonvolatile Semiconductor Memory Element According to Embodiment 2]

FIG. 13A to FIG. 13D are a diagram illustrating a configuration of a neural network circuit according to Embodiment 2, a diagram illustrating a truth table of the neural network circuit, a diagram illustrating values of connection weight coefficients of the neural network circuit, and a diagram illustrating computational operations performed by an input layer, a hidden layer, and an output layer of the neural network circuit.

Figures 13A, 13B:
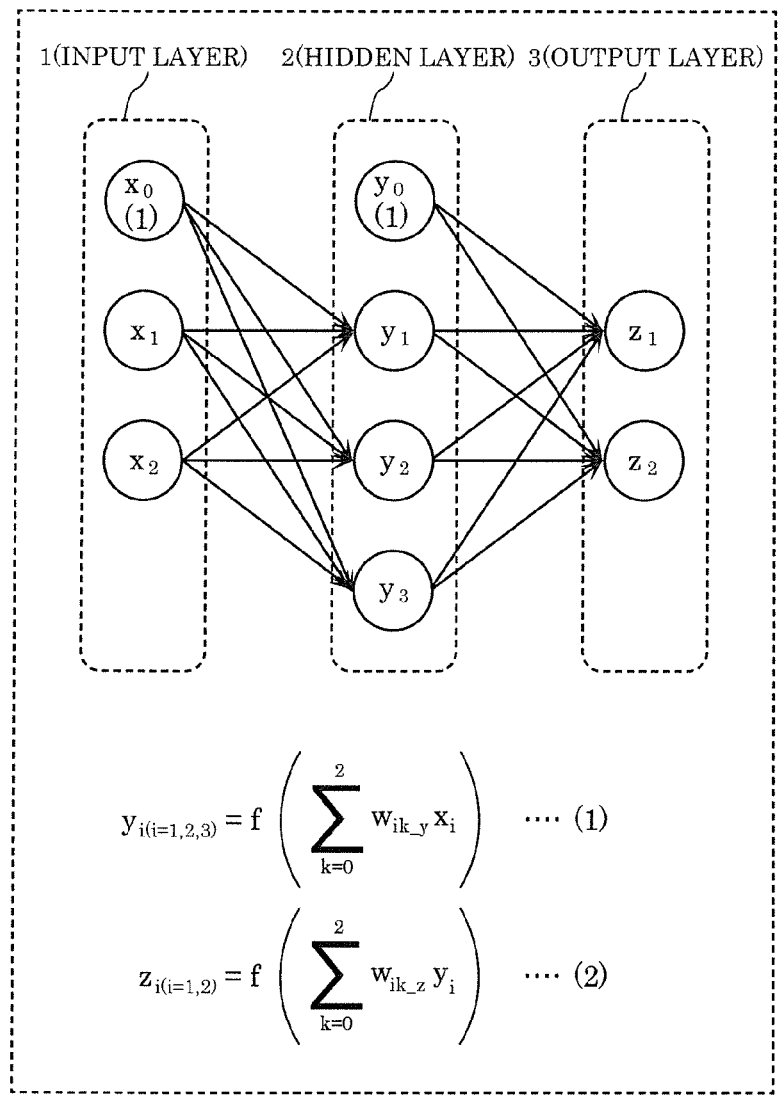
FIG. 13A is a diagram illustrating a configuration of neural network computation according to Embodiment 2.
FIG. 13B is a truth table of a neural network circuit according to Embodiment 2.

FIG. 13A is a diagram illustrating a detailed configuration of a neural network computation circuit according to Embodiment 2. The neural network circuit according to Embodiment 2 is a multilayer neural network circuit including input layer 1, hidden layer 2, and output layer 3.

Input layer 1 has three inputs $x_0$ to $x_2$. Input $x_0$ is always an input of 1. As illustrated in FIG. 4, hidden layer 2 computes a bias coefficient using input $x_0$ and the corresponding connection weight coefficient. Two inputs $x_1$ and $x_2$ are inputted from the outside.

Hidden layer 2 has one input $y_0$ and three neurons $y_1$ to $y_3$. Input $y_0$ is always an input of 1. As illustrated in FIG. 4, output layer 3 computes a bias coefficient using input $y_0$ and the corresponding connection weight coefficient. Three neurons $y_1$ to $y_3$ each receive three inputs $x_0$ to $x_2$ and the corresponding connection weight coefficients from input layer 1, and output outputs $y_1$ to $y_3$.

Output layer 3 has two neurons $z_1$ and $z_2$. Neurons $z_1$ and $z_2$ each receive four inputs $y_0$ to $y_3$ and the corresponding connection weight coefficients from hidden layer 2, and output outputs $z_1$ and $z_2$.

Neural network computations performed by neurons $y_1$ to $y_3$, $z_1$, and $z_2$ are expressed by equation (1) and equation (2) in FIG. 13A. Here, connection weight coefficient $w_{ik\_y}$ is used in calculations performed by neurons $y_1$ to $y_3$ of hidden layer 2, connection weight coefficient $w_{ik\_z}$ is used in calculations performed by output layer 3, and activation function f is a step function.

FIG. 13B is a diagram illustrating a truth table of the neural network circuit according to Embodiment 2. Two inputs $x_1$ and $x_2$ and output $z_1$ and $z_2$ take a value of 0 or a value of 1. Output $z_1$ is 1 only when both inputs $x_1$ and $x_2$ are 1, and is 0 in the other cases. In addition, output $z_2$ is 0 only when both inputs $x_1$ and $x_2$ are 1, and is 1 in the other cases. In other words, the neural network circuit according to Embodiment 2 outputs output $z_1$ resulting from an AND operation between inputs $x_1$ and $x_2$, and outputs output $z_2$ resulting from a NAND operation between inputs $x_1$ and $x_2$.

FIG. 13C is a diagram illustrating connection weight coefficients of the neural network computation circuit according to Embodiment 2. Neurons $y_1$ to $y_3$ of hidden layer 2 each have three connection weight coefficients respectively corresponding to three inputs $x_0$ to $x_2$. Neurons $z_1$ and $z_2$ of output layer 3 each have four connection weight coefficients respectively corresponding to four inputs $y_0$ to $y_3$.

FIG. 13D is a diagram illustrating computational operations performed by an input layer, a hidden layer, and an output layer of the neural network circuit according to Embodiment 2. There are four combinations of inputs of input layer 1. FIG. 13D shows: results of multiply-accumulate operations performed by neurons $y_1$ to $y_3$ that have received inputs $x_0$ to $x_2$ from input layer 1, and an output result of an activation function (step function) using the results of the multiply-accumulate operations as inputs, in hidden layer 2; and results of multiply-accumulate operations performed by neurons $z_1$ and $z_2$ that have received inputs $y_0$ to $y_3$ from hidden layer 2, and an output result of the activation function (step function) using the results of multiply-accumulate operations as inputs, in output layer 3. As shown by the truth table of FIG. 13B, output $z_1$ resulting from an AND operation between inputs $x_1$ and $x_2$ is outputted, and output $z_2$ resulting from a NAND operation between inputs $x_1$ and $x_2$ is outputted.

FIG. 14A and FIG. 14B each are a diagram illustrating a current range of variable resistance elements of a computation unit of the neural network computation circuit according to Embodiment 2, and current values to be written into the variable resistance elements. As illustrated in FIG. 14A, just like Embodiment 1, a possible range of current values flowing in variable resistance elements RP and RN is from 0 μA to 50 μA in Embodiment 2. Stated differently, a current value has minimum value $I_{min}$ of 0 μA and maximum value $I_{max}$ of 50 μA, and a 50-μA current range (dynamic range) is used.

FIG. 14B is a diagram illustrating current values for writing, into variable resistance elements of computation units, connection weight coefficients used in neural network computations performed by neurons $y_1$ to $y_3$ of hidden layer 2 and neurons $z_1$ and $z_2$ of output layer 3. First, connection weight coefficients normalized to be in a range from 0 to 1 are calculated, and current values to be written into variable resistance elements RP and RN are determined based on the normalized connection weight coefficients. Connection weight coefficients are normalized for each neuron.

The following describes a method of calculating current values for writing, into variable resistance elements RP and RN, connection weight coefficients $w_{10\_y}=+0.8$, $w_{11\_y}=-0.6$, and $w_{12\_y}=-0.4$ of neuron $y_1$ of hidden layer 2. The three connection weight coefficients are written as resistance values (current values) into variable resistance elements RP and RN of each of three computation units. In normalizing connection weight coefficients, among connection weight coefficients $w_{10\_y}$, $w_{11\_y}$, and $w_{12\_y}$, $w_{10\_y}=+0.8$ has the largest absolute value, and the normalized value of this connection weight coefficient is $w_{10\_y}=+1.0$. The normalized values of the remaining connection weight coefficients are $w_{11\_y}=-0.75$ and $w_{12\_y}=-0.5$.

Next, as illustrated in FIG. 14A, current values to be written into variable resistance elements RP and RN of the computation unit are determined using the normalized connection weight coefficients. FIG. 14B shows a result of calculations of the current values to be written into variable resistance elements RP and RN. Since the normalized value of connection weight coefficient $w_{10\_y}$ is +1.0, a positive value, the current value to be written into variable resistance element RP is 50 μA, and the current value to be written into variable resistance element RN is 0 μA. Since the normalized value of connection weight coefficient $w_{11\_y}$ is −0.75, a negative value, the current value to be written into variable resistance element RP is 0 μA, and the current value to be written into variable resistance element RN is 37.5 μA. Since the normalized value of connection weight coefficient $w_{12\_y}$ is −0.5, a negative value, the current value to be written into variable resistance element RP is 0 μA, and the current value to be written into variable resistance element RN is 25 μA. Similarly, FIG. 14B shows a result of calculations of current values to be written into variable resistance elements RP and RN of the computation units relative to neurons $y_2$ and $y_3$ of hidden layer 2 and neuron $z_1$ of output layer 3.

A computational operation of the neural network circuit determines output data of hidden layer 2 by writing the current values (resistance values) illustrated in FIG. 14B into variable resistance elements RP and RN of computation units disposed in a memory cell array, using input data of input layer 1 as inputs, selecting the computation units in which connection weight coefficients necessary for computations in hidden layer 2 are stored, and detecting and determining currents flowing in bit lines. Next, the computational operation determines output data of output layer 3 by using output data of hidden layer 2 as inputs, selecting the computation units in which connection weight coefficients necessary for computations in output layer 3 are stored, and detecting and determining current flowing in the bit lines. The neural network circuit can perform a multilayer neural network computation by being caused to operate in the above manner.

Figure 15C:
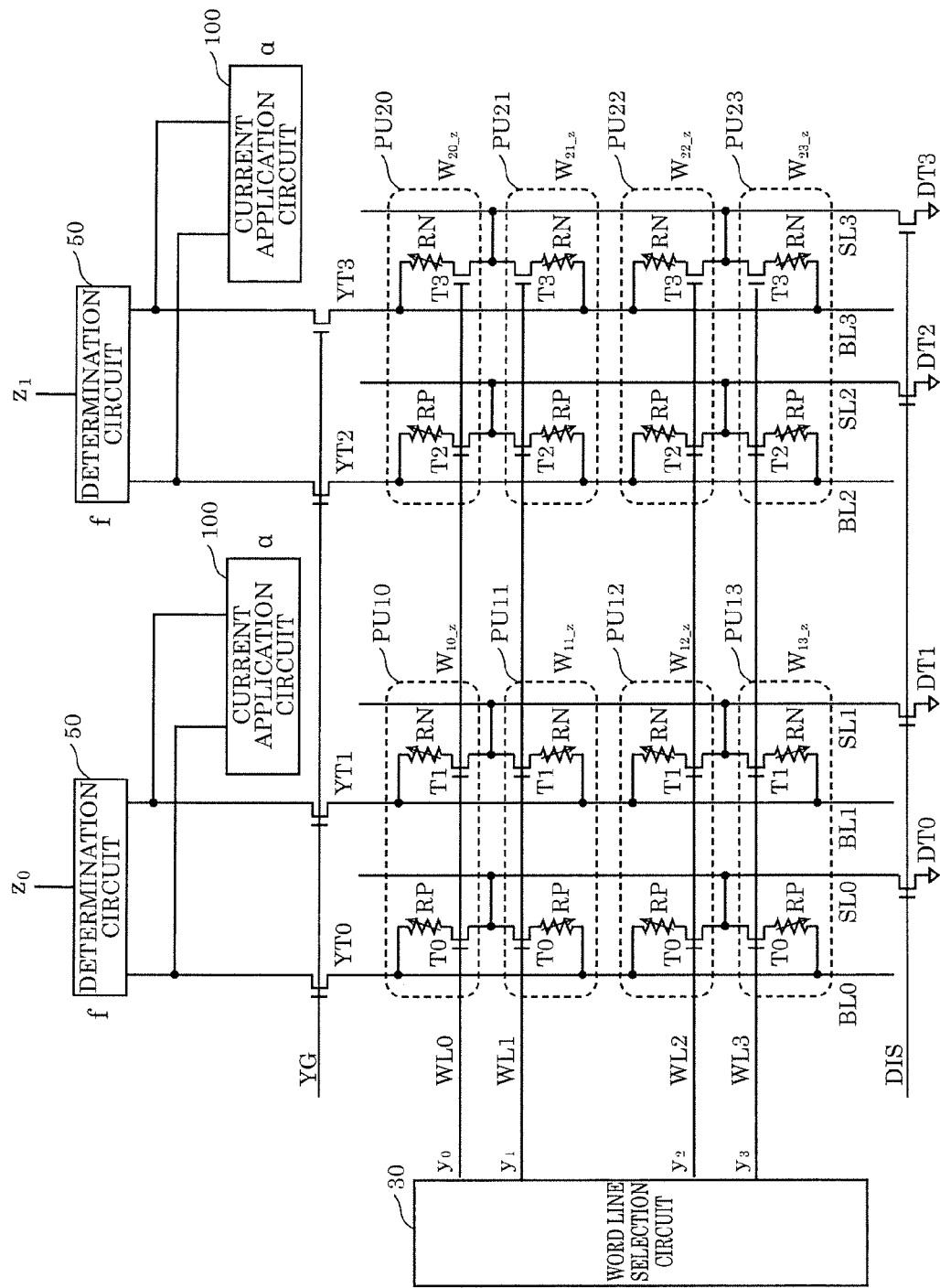
FIG. 15C is a diagram illustrating a detailed configuration of the neural network computation circuit for the output layer according to Embodiment 2.

FIG. 15A to FIG. 15C illustrate a method of canceling an error in writing a connection weight coefficient, using the current application circuit in the neural network circuit according to Embodiment 2. FIG. 15A is a diagram illustrating connection weight coefficients of an output layer. For connection weight coefficient $w_{20\_z}$, an ideal value is −0.2, and a result of writing is +0.1. For connection weight coefficient $w_{22\_z}$, an ideal value is −0.3, and a result of writing is −0.8.

FIG. 15C is a diagram illustrating a detailed configuration of a neural network computation circuit for the output layer according to Embodiment 2. In FIG. 15C, the same elements as in FIG. 1B are assigned the same reference numerals and numbers, and the detailed description thereof will be omitted. The neural network computation circuit for the output layer according to Embodiment 2 is a neuron having four inputs and two outputs, and includes: four computation units PU10 to PU13 that store connection weight coefficients $w_{10\_z}$ to $w_{13\_z}$; four computation units PU20 to PU23 that store connection weight coefficients $w_{20\_z}$ to $w_{23\_z}$; four word lines WL0 to WL3 corresponding to inputs $y_0$ to $y_3$; bit line BL0 and source line SL0 to which variable resistance element RP and cell transistor T0 are connected; bit line BL1 and source line SL1 to which variable resistance element RN and cell transistor T1 are connected; bit line BL2 and source line SL2 to which variable resistance element RP and cell transistor T2 are connected; and bit line BL3 and source line SL3 to which variable resistance element RN and cell transistor T3 are connected. In addition, current application circuit 100 is connected to bit line BL0 and bit line BL1, and current application circuit 100 is also connected to bit line BL2 and bit line BL3.

When a neural network computational operation is performed, each of word lines WL0 to WL3 and cell transistors T0 to T3 of computation units PU10 to PU13 and PU20 to PU23 are placed in a selection state or a non-selection state according to inputs $x_0$ to $x_3$. Bit lines BL0 to BL3 are supplied with bit line voltage via column gates YT0 to YT3 by determination circuit 50, and source lines SL0 to SL3 are connected to ground voltage via discharge transistors DT0 to DT3. For this reason, a current equivalent to a positive result of a multiply-accumulate operation corresponding to output $z_0$ flows in bit line BL0, and a current equivalent to a negative result of a multiply-accumulate operation corresponding to output $z_0$ flows in bit line BL1. Moreover, a current equivalent to a positive result of a multiply-accumulate operation corresponding to output $z_1$ flows in bit line BL2, and a current equivalent to a negative result of a multiply-accumulate operation corresponding to output $z_1$ flows in bit line BL3. Determination circuit 50 detects and determines a magnitude relationship between the currents flowing in bit lines BL0 and BL1, to output output $z_0$. In addition, determination circuit 50 detects and determines a magnitude relationship between the currents flowing in bit lines BL2 and BL3, to output output $z_1$. Stated differently, determination circuit 50 outputs 0 when the result of the multiply-accumulate operation is a negative value (<0), and outputs 1 when the result of the multiply-accumulate operation is a positive value (≥0). Determination circuit 50 outputs a result of the computation using activation function f (step function) using the result of the multiply-accumulate operation as an input. However, as with the neural network computation according to Embodiment 2 of the present disclosure, in a neural network computation in which one of two outputs $z_0$ and $z_1$ indicating 1 is outputted, there is a case in which both outputs indicating 1 are outputted or a case in which both outputs indicating 0 are outputted, due to an error in writing a connection weight coefficient or an error of the determination circuit, etc. When both outputs are 1, it is possible to change, from 1 to 0, the outputs of the determination circuit with a small difference between currents applied to the determination circuit, by current application circuit 100 applying a current to each of bit lines BL1 and BL3. When both outputs are 0, it is possible to change, from 0 to 1, the outputs of the determination circuit with a small difference between currents applied to the determination circuit, by current application circuit 100 applying a current to each of bit lines BL0 and BL2.

FIG. 15B is a diagram illustrating results of neural network computations performed by the output layer according to Embodiment 2. In a neural network computation using ideal values, output $z_1$ resulting from an AND operation between inputs $x_1$ and $x_2$ is outputted, and output $z_2$ resulting from a NAND operation between inputs $x_1$ and $x_2$ is outputted. However, when there are errors in results of writing connection weight coefficients as illustrated in FIG. 15A, there is a case in which both outputs $z_1$ and $z_2$ indicating 1 are outputted or a case in which both outputs $z_1$ and $z_2$ indicating 0 are outputted. It is possible to configure a neural network computation circuit that, even when there are errors in results of writing connection weight coefficients, outputs output $z_1$ resulting from an AND operation between inputs $x_1$ and $x_2$, and output $z_2$ resulting from a NAND operation between inputs $x_1$ and $x_2$, by applying to bit lines BL1 and BL3 a current equivalent to −0.5 as connection weight coefficient α when both outputs $z_1$ and $z_2$ indicating 1 are outputted, and applying to bit lines BL0 and BL2 a current equivalent to +0.5 as connection weight coefficient α when both outputs $z_1$ and $z_2$ indicating 0 are outputted.

[Conclusion]

As described above, the neural network computation circuit including the non-volatile semiconductor memory element of the present disclosure performs a multiply-accumulate operation using current values flowing in the non-volatile semiconductor memory element. With this, the neural network computation circuit can perform a multiply-accumulate operation without including a large-capacity memory circuit, a large-capacity register circuit, a large-scale multiplication circuit, a large-scale cumulative circuit (accumulator circuit), and a complex control circuitry that are configured as conventional digital circuits. Accordingly, it is possible to reduce the power consumption of the neural network computation circuit, and decrease the chip area of a semiconductor integrated circuit. Moreover, since the neural network circuit includes neurons with input data and output data that are digital data of 0 or 1, it is possible to digitally transmit information between neurons, it is easy to mount a large-scale neural network circuit including neurons, and it is possible to integrate large-scale neural network circuits. In other words, the neural network computation circuit including the non-volatile semiconductor memory element of the present disclosure enables the low power consumption and the large-scale integration.

Although the embodiments of the present disclosure have been described above, the neural network computation circuit including the non-volatile semiconductor memory element of the present disclosure is not limited to the above-described examples. The present disclosure is effective for embodiments to which various modifications etc. are made without departing from the scope of the present disclosure.

For example, although the neural network computation circuit including the non-volatile semiconductor memory element in the aforementioned embodiments is an example of a variable resistance non-volatile memory (ReRAM), the present disclosure is applicable to a non-volatile semiconductor memory element other than a variable resistance memory, such as a magnetoresistive non-volatile memory (MRAM), a phase-change non-volatile memory (PRAM), and a ferroelectric non-volatile memory (FeRAM).

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

Since the neural network computation circuit including the non-volatile semiconductor memory element according to the present disclosure is configured to perform a multiply-accumulate operation using the non-volatile semiconductor memory element, the neural network computation circuit can perform a multiply-accumulate operation without including a multiplication circuit and a cumulative circuit (accumulator circuit) configured as conventional digital circuits. Moreover, digitizing input data and output data makes it easy to integrate large-scale neural network circuits.

Accordingly, the present disclosure is effective in ensuring that the neural network computation circuit achieves the low power consumption and the large-scale integration, and is useful for, for example, a semiconductor integrated circuit equipped with artificial intelligence (AI) technology that performs self-learning and self-determination, and an electronic device including such semiconductor integrated circuits.

What is claimed is:

1. A neural network computation circuit that includes a non-volatile semiconductor memory element and outputs output data of a first logical value or a second logical value, based on a result of a multiply-accumulate operation between input data of the first logical value or the second logical value and connection weight coefficients respectively corresponding to the input data, the neural network computation circuit comprising:
   a plurality of word lines;
   a first data line;
   a second data line;
   a third data line;
   a fourth data line;
   a plurality of computation units each of which includes a series connection of a first non-volatile semiconductor memory element and a first cell transistor, and a series connection of a second non-volatile semiconductor memory element and a second cell transistor, the first non-volatile semiconductor memory element having one end connected to the first data line and has a resistance value that is variable, the first cell transistor having one end connected to the second data line and a gate connected to one of the plurality of word lines, the second non-volatile semiconductor memory element having one end connected to the third data line and has a resistance value that is variable, the second cell transistor having one end connected to the fourth data line and a gate connected to one of the plurality of word lines;

a word line selection circuit that places the plurality of word lines in a selection state or a non-selection state;

a determination circuit that determines a magnitude relationship between voltage values or current values applied to the first data line and the third data line or the second data line and the fourth data line, to output the first logical value or the second logical value; and a current application circuit that is connected to at least one of the first data line, the second data line, the third data line, or the fourth data line, wherein the neural network computation circuit sets resistance values corresponding to the connection weight coefficients to the first non-volatile semiconductor memory element and the second non-volatile semiconductor memory element of each of the plurality of computation units, the neural network computation circuit has a function of adjusting any of the connection weight coefficients by the current application circuit applying a current to one of the first data line, the second data line, the third data line, and the fourth data line, the word line selection circuit places the plurality of word lines in the selection state or the non-selection state according to the input data, the determination circuit outputs output data, the plurality of computation units are equal in number to the input data, the plurality of computation units are connected in parallel to the first data line and the third data line, thereby causing a current value corresponding to a result of a multiply-accumulate operation to flow in the first data line or the third data line, in the adjusting of any of the connection weight coefficients, the neural network computation circuit determines a connection weight coefficient to be added, and causes the current application circuit to apply a current corresponding to the connection weight coefficient to be added determined to the first data line, the second data line, the third data line, or the fourth data line that corresponds to the connection weight coefficient to be added, and the determination circuit determines the magnitude relationship using a current value obtained by adding (i) the current applied by the current application circuit and corresponding to the connection weight coefficient to be added to (ii) the current value corresponding to the result of the multiply-accumulate operation.

2. The neural network computation circuit according to claim 1,
wherein the current application circuit includes a first current source that is connected to ground and a fifth data line and outputs constant current to the fifth data line, and the fifth data line is connected to at least one of the first data line and the second data line via a first switch transistor or the third data line and the fourth data line via a second switch transistor.

3. The neural network computation circuit according to claim 1,
wherein the current application circuit includes a first current source that is connected to ground and a fifth data line and outputs constant current to the fifth data line, and a second current source that is connected to ground and a sixth data line and outputs constant current to the sixth data line,
the fifth data line is connected to the first data line or the second data line via a first switch transistor, and
the sixth data line is connected to the third data line or the fourth data line via a second switch transistor.

4. The neural network computation circuit according to claim 1,
wherein the current application circuit includes a first current generation circuit that has a first end connected to ground and a second end connected to a seventh data line and an eighth data line,
the first current generation circuit outputs generated current to the second end,
the seventh data line or the eighth data line is connected to one of the first data line and the second data line via a first switch transistor, and
the eighth data line is connected to one of the third data line and the fourth data line via a second switch transistor.

5. The neural network computation circuit according to claim 1,
wherein the current application circuit includes:
a first current generation circuit that has a first end connected to a seventh data line, a second end connected to an eighth data line, and that outputs generated current to the seventh data line or the eighth data line; and
a second current generation circuit that has one end connected to a ninth data line, a second end connected to a tenth data line, and that outputs generated current to the ninth data line or the tenth data line,
the seventh data line or the eighth data line is connected to the first data line or the second data line via a first switch transistor, and
the ninth data line or the tenth data line is connected to the third data line or the fourth data line via a second switch transistor.

6. The neural network computation circuit according to claim 4,
wherein the first current generation circuit is configured as a first resistance element,
one end of the first resistance element is connected to the seventh data line, and
another end of the first resistance element is connected to the eighth data line.

7. The neural network computation circuit according to claim 4,
wherein the first current generation circuit is configured as a load transistor,
one end of the load transistor is connected to the seventh data line,
another end of the load transistor is connected to the eighth data line, and
a gate of the load transistor is connected to a load gate line.

8. The neural network computation circuit according to claim 4,
wherein in the first current generation circuit, at least one parallel connection of series connections each of which is a series connection of a first resistance element and a first selection transistor is provided, one end of the first resistance element is connected to the seventh data line, one end of the first selection transistor is connected to the eighth data line, and a gate of the first selection transistor is connected to a selection gate line.

9. The neural network computation circuit according to claim 4, wherein in the first current generation circuit, at least one parallel connection of series connection each of which is a series connection of a load transistor and a selection transistor is provided, one end of the load transistor is connected to the seventh data line, one end of the selection transistor is connected to the eighth data line, a gate of the load transistor is connected to a load gate line, and a gate of the selection transistor is connected to a selection gate line.

10. The neural network computation circuit according to claim 5, wherein the first current generation circuit and the second current generation circuit each are configured as a first resistance element, one end of the first resistance element is connected to the seventh data line or the ninth data line, and another end of the first resistance element is connected to the eighth data line or the tenth data line.

11. The neural network computation circuit according to claim 5, wherein the first current generation circuit and the second current generation circuit each are configured as a load transistor, one end of the load transistor is connected to the seventh data line or the ninth data line, another end of the load transistor is connected to the eighth data line or the tenth data line, and a gate of the load transistor is connected to a load gate line.

12. The neural network computation circuit according to claim 5, wherein in each of the first current generation circuit and the second current generation circuit, at least one parallel connection of series connections each of which is a series connection of a first resistance element and a first selection transistor is provided, one end of the first resistance element is connected to the seventh data line or the ninth data line, one end of the first selection transistor is connected to the eighth data line or the tenth data line, and a gate of the first selection transistor is connected to a selection gate line.

13. The neural network computation circuit according to claim 5, wherein in each of the first current generation circuit and the second current generation circuit, at least one parallel connection of series connections each of which is a series connection of a load transistor and a selection transistor is provided, one end of the load transistor is connected to the seventh data line or the ninth data line, one end of the selection transistor is connected to the eighth data line or the tenth data line, a gate of the load transistor is connected to a load gate line, and a gate of the selection transistor is connected to a selection gate line.

14. The neural network computation circuit according to claim 1, wherein the current application circuit includes at least one current application unit including a series connection of a second resistance element and a third cell transistor, and a series connection of a third resistance element and a fourth cell transistor, the second resistance element having one end connected to the first data line, the third cell transistor having one end connected to the second data line and a gate connected to one of the plurality of word lines, the third resistance element having one end connected to the third data line, the fourth cell transistor having one end connected to the fourth data line and a gate connected to one of the plurality of word lines.

15. The neural network computation circuit according to claim 6, wherein the first resistance element is configured as a fixed resistance element or a third non-volatile semiconductor memory element.

16. The neural network computation circuit according to claim 14, wherein the second resistance element and the third resistance element each are configured as a fixed resistance element or a third non-volatile semiconductor memory element.

17. The neural network computation circuit according to claim 1, wherein in storing the connection weight coefficients in the first non-volatile semiconductor memory element and the second non-volatile semiconductor memory element of each of the plurality of computation units:

when a connection weight coefficient is a positive value, the connection weight coefficient is written into the first non-volatile semiconductor memory element so that a current value flowing in the first non-volatile semiconductor memory element is in proportion to a value of the connection weight coefficient; and when a connection weight coefficient is a negative value, the connection weight coefficient is written into the second non-volatile semiconductor memory element so that a current value flowing in the second non-volatile semiconductor memory element is in proportion to a value of the connection weight coefficient.

18. The neural network computation circuit according to claim 1, wherein in storing the connection weight coefficients in the first non-volatile semiconductor memory element and the second non-volatile semiconductor memory element of each of the plurality of computation units:

when a connection weight coefficient is a positive value, the connection weight coefficient is written into the first non-volatile semiconductor memory element and the second non-volatile semiconductor memory element so that a current value flowing in the first non-volatile semiconductor memory element is higher than a current value flowing in the second non-volatile semiconductor memory element, and a current difference between the current values is in proportion to a value of the connection weight coefficient; and when a connection weight coefficient is a negative value, the connection weight coefficient is written into the first non-volatile semiconductor memory element and the second non-volatile semiconductor memory element so that a current value flowing in the second non-volatile semiconductor memory element is higher than a current value flowing in the first non-volatile semiconductor memory element, and a current difference between the current values is in proportion to a value of the connection weight coefficient.

19. The neural network computation circuit according to claim 1,
wherein the word line selection circuit:
places a corresponding word line in the non-selection state when the input data indicate the first logical value; and
places a corresponding world line in the selection state when the input data indicate the second logical value.

20. The neural network computation circuit according to claim 1,
wherein a current value flows in the first data line or the second data line, the current value corresponding to a result of a multiply-accumulate operation between input data having connection weight coefficients that are positive values and corresponding connection weight coefficients having positive values, and
a current value flows in the third data line or the fourth data line, the current value corresponding to a result of a multiply-accumulate operation between input data having connection weight coefficients that are negative values and corresponding connection weight coefficients having negative values.

21. The neural network computation circuit according to claim 1,
wherein the determination circuit:
outputs the first logical value when a current value flowing in the first data line or the second data line is lower than a current value flowing in the third data line or the fourth data line; and
outputs the second logical value when a current value flowing in the first data line or the second data line is higher than a current value flowing in the third data line or the fourth data line.

22. The neural network computation circuit according to claim 1,
wherein when the current application circuit is connected to the first data line or the second data line and applies a current to the first data line or the second data line, a sum of (i) a current value corresponding to a result of a multiply-accumulate operation between input data having connection weight coefficients that are positive values and corresponding connection weight coefficients having positive values and (ii) a current value applied by the current application circuit flows in the first data line or the second data line, and
when the current application circuit is connected to the third data line or the fourth data line and applies a current to the third data line or the fourth data line, a sum of (i) a current value corresponding to a result of a multiply-accumulate operation between input data having connection weight coefficients that are negative values and corresponding connection weight coefficients having negative values and (ii) a current value applied by the current application circuit flows in the third data line or the fourth data line.

* * * * *